(12) United States Patent
Murase

(10) Patent No.: US 9,401,413 B2
(45) Date of Patent: Jul. 26, 2016

(54) SEMICONDUCTOR DEVICE

(71) Applicant: Renesas Electronics Corporation, Kanagawa (JP)

(72) Inventor: Yasuhiro Murase, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 22 days.

(21) Appl. No.: 14/193,780

(22) Filed: Feb. 28, 2014

(65) Prior Publication Data

US 2014/0264441 A1    Sep. 18, 2014

(30) Foreign Application Priority Data

Mar. 15, 2013   (JP) ................................. 2013-053868

(51) Int. Cl.
| H01L 21/02 | (2006.01) |
|---|---|
| H01L 29/66 | (2006.01) |
| H01L 29/778 | (2006.01) |
| H01L 29/207 | (2006.01) |
| H01L 29/20 | (2006.01) |
| H01L 29/06 | (2006.01) |
| H01L 29/10 | (2006.01) |

(52) U.S. Cl.
CPC ........ H01L 29/66462 (2013.01); H01L 29/207 (2013.01); H01L 29/7787 (2013.01); *H01L 29/0619* (2013.01); *H01L 29/1066* (2013.01); *H01L 29/2003* (2013.01)

(58) Field of Classification Search
CPC ............ H01L 29/66462; H01L 29/207; H01L 29/7787
USPC ........................................................ 257/190
See application file for complete search history.

(56) References Cited

U.S. PATENT DOCUMENTS

| 7,038,252 B2 | 5/2006 | Saito et al. | |
|---|---|---|---|
| 2010/0258841 A1* | 10/2010 | Lidow ................. | H01L 29/1066 257/192 |
| 2011/0193096 A1* | 8/2011 | Imada ................. | H01L 29/7788 257/76 |
| 2012/0193637 A1* | 8/2012 | Kalnitsky ............ | H01L 29/1066 257/76 |
| 2013/0240901 A1* | 9/2013 | Kohda ................ | H01L 29/2003 257/76 |

FOREIGN PATENT DOCUMENTS

| JP | 2005-183551 A | 7/2005 |
|---|---|---|
| JP | 2005-244072 A | 9/2005 |

* cited by examiner

*Primary Examiner* — Jamie C Niesz
(74) *Attorney, Agent, or Firm* — Sughrue Mion, PLLC

(57) ABSTRACT

The semiconductor device has a barrier layer formed on a channel layer, an n type diffusion preventing layer formed on the barrier layer and containing aluminum, and a source electrode and a drain electrode formed on the diffusion preventing layer. The semiconductor device further has a p type cap layer formed on the diffusion preventing layer sandwiched between the source electrode and the drain electrode and a gate electrode formed on the cap layer. The diffusion preventing layer has an aluminum composition ratio greater than the aluminum composition ratio of the barrier layer.

9 Claims, 16 Drawing Sheets

SEMICONDUCTOR DEVICE

CROSS-REFERENCE TO RELATED APPLICATIONS

The disclosure of Japanese Patent Application No. 2013-053868 filed on Mar. 15, 2013 including the specification, drawings and abstract is incorporated herein by reference in its entirety.

BACKGROUND

The present invention relates to a semiconductor device, for example, a technology preferably used for a semiconductor device using a nitride semiconductor.

A nitride semiconductor such as gallium nitride (GaN) is expected to be used for transistors for high breakdown voltage, high output, or high frequency because of a band gap and electron mobility greater than those of silicon (Si) or gallium arsenic (GaAs). Power control field effect transistors, that is, power devices using a nitride semiconductor such as gallium nitride have therefore been under development.

Japanese Patent Laid-Open No. 2005-183551 (Patent Document 1) and Japanese Patent Laid-Open No. 2005-244072 (Patent Document 2) describe a technology relating to a field effect transistor using gallium nitride as a nitride semiconductor layer. The field effect transistors described in Patent Documents 1 and 2 have a channel layer, a barrier layer formed on the channel layer, and a gate electrode formed on the barrier layer.

[Patent Document 1] Japanese Patent Laid-Open No. 2005-183551

[Patent Document 2] Japanese Patent Laid-Open No. 2005-244072

SUMMARY

As a power device to which a field effect transistor using a nitride semiconductor such as gallium nitride has been applied, a so-called normally-off type field effect transistor with no electric current flowing between its source electrode and drain electrode when no voltage is applied to its gate electrode is important. As this normally-off type field effect transistor, as described in Patent Document 2, there has been proposed a field effect transistor having, below the gate electrode thereof, a p type semiconductor layer made of gallium nitride.

When a semiconductor device during manufacturing steps is heat treated, however, diffusion of a p type impurity may occur between a p type semiconductor layer and a barrier layer and prevent the semiconductor device from operating as a normally-off type field effect transistor. In addition, during etching of the p type semiconductor layer, the barrier layer may be etched, resulting in a decrease in the thickness of the barrier layer and an increase in access resistance.

Thus, in the manufacturing steps of a semiconductor device having a normally-off type field effect transistor using a nitride semiconductor such as gallium nitride, it is impossible to suppress diffusion of a p type impurity between its p type semiconductor layer and barrier layer and a decrease in the thickness of the barrier layer so that the semiconductor device thus obtained has deteriorated performance.

Another problem and novel features of the invention will be apparent from the description herein and accompanying drawings.

According to one embodiment, a semiconductor device has a barrier layer formed on a channel layer, an aluminum-containing n type diffusion preventing layer formed on the barrier layer, and a source electrode and a drain electrode formed on the diffusion preventing layer. The semiconductor device further has a p type cap layer formed on the diffusion preventing layer sandwiched between the source electrode and the drain electrode and a gate electrode formed on the cap layer. An aluminum composition ratio of the diffusion preventing layer is greater than that of the barrier layer.

According to another embodiment, a semiconductor device has a barrier layer formed on a channel layer and a source electrode and a drain electrode formed on the barrier layer. The semiconductor device further has an aluminum-containing n type diffusion preventing layer formed on the barrier layer sandwiched between the source electrode and the drain electrode, a p type cap layer formed on the diffusion preventing layer, and a gate electrode formed on the cap layer. An aluminum composition ratio of the diffusion preventing layer is greater than that of the barrier layer.

According to the embodiment, a semiconductor device having improved performance can be provided.

DETAILED DESCRIPTION

Figure 1:
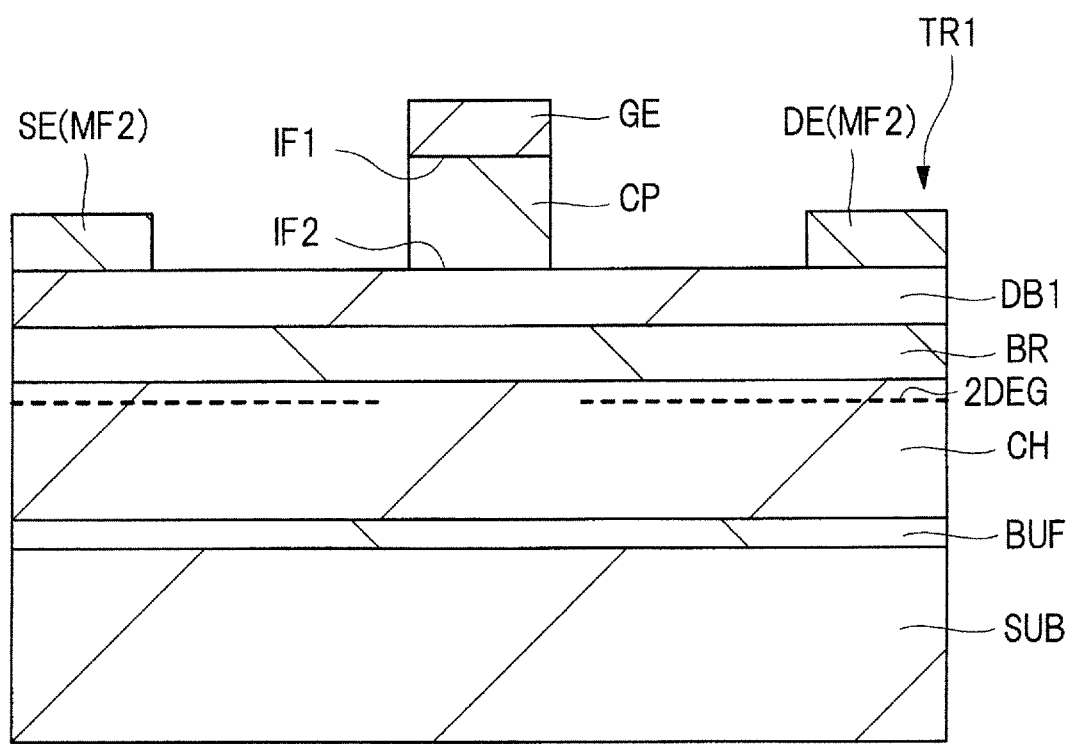
FIG. 1 is a fragmentary cross-sectional view of a semiconductor device according to First Embodiment.

In the following embodiments, descriptions are divided into a plurality of sections or embodiments if necessary for convenience's sake. These sections or embodiments are not independent each other, but in a relation such that one is a modification example, details or complementary description of a part or whole of the other one unless otherwise specifically indicated.

In the following embodiments, when a reference is made to the number of components (including the number, value, amount, range, or the like), the number is not limited to a specific number but can be greater than or less than the specific number unless otherwise specifically indicated or principally apparent that the number is limited to the specific number.

Moreover in the following embodiments, it is needless to say that the constituent components (including component steps) are not always essential unless otherwise specifically indicated or principally apparent that they are essential. Similarly, in the following embodiments, when a reference is made to the shape, positional relationship, or the like of the constituent components, that substantially analogous or similar to the shape or the like is also embraced unless otherwise specifically indicated or principally apparent that it is not. This also applies to the above-mentioned value, range, or the like.

Typical embodiments will next be described in detail referring to drawings. In all the drawings for describing these embodiments, members having the same functions are identified by the same reference numerals and an overlapping description of them is not repeated. In the following embodiments, descriptions on the same or similar portions are not repeated in principle unless otherwise particularly necessary.

In the drawings used in the embodiments, hatching may be omitted even from a cross-sectional view in order to facilitate understanding of it.

(First Embodiment) <Structure of Semiconductor Device> A semiconductor device of First Embodiment is a semiconductor device having a field effect transistor and it is a semiconductor device having a high electron mobility transistor (HEMT) as the field effect transistor.

FIG. 1 is a fragmentary cross-sectional view of the semiconductor device of First Embodiment.

As shown in FIG. 1, the semiconductor device of First Embodiment is equipped with, as a field effect transistor, a transistor TR1 which is an HEMT. The transistor TR1 has a substrate SUB, a buffer layer BUF formed on the substrate SUB, a channel layer CH formed on the buffer layer BUF and made of a nitride semiconductor layer, and a barrier layer BR formed on the channel layer CH and made of a nitride semiconductor layer. The transistor TR1 further has a diffusion preventing layer DB1 formed on the barrier layer BR and made of a nitride semiconductor layer.

In addition, the transistor TR1 has, on the diffusion preventing layer DB1, a source electrode SE and a drain electrode DE separated from each other. The transistor TR1 has, on an upper surface of the diffusion preventing layer DB1 sandwiched between the source electrode SE and the drain electrode DE, a cap layer CP separated from each of the source electrode SE and the drain electrode DE and made of a nitride semiconductor layer. The transistor TR1 further has a gate electrode GE formed on the cap layer CP.

In short, in the semiconductor device of First Embodiment, the barrier layer BR and the cap layer CP have therebetween the diffusion preventing layer DB1. In addition, each of the source electrode SE and the drain electrode DE and the barrier layer BR have therebetween the diffusion preventing layer DB1.

The substrate SUB is a semiconductor substrate (single crystal silicon substrate) made of, for example, silicon (Si). The material of the substrate SUB is not particularly limited insofar as it has crystallinity necessary for providing a nitride semiconductor layer to be formed thereover with desired properties. Therefore, as the substrate SUB, for example, a sapphire substrate, a silicon carbide (SiC) substrate, a gallium nitride (GaN) substrate, or the like can be used.

The substrate SUB has thereon the buffer layer BUF. The buffer layer BUF is formed in order to relax a difference in lattice constant between the substrate SUB and the channel layer CH. For example, a difference in lattice constant between silicon (Si) configuring the substrate SUB and gallium nitride (GaN) configuring the channel layer CH can be relaxed by this buffer layer BUF.

When the channel layer CH made of gallium nitride (GaN) is formed directly on the substrate SUB made of silicon, a good epitaxial growth layer cannot be obtained due to many cracks formed in the channel layer CH. This may make it difficult to form an HEMT. Therefore, the buffer layer BUF for lattice relaxation is inserted between the substrate SUB and the channel layer CH. When the buffer layer BUF is formed, a good epitaxial growth layer can be obtained as the channel layer CH to be formed on the buffer layer BUF, facilitating formation of the HEMT.

The material of the buffer layer BUF is not particularly limited insofar as it has crystallinity necessary for providing the channel layer CH, barrier layer BR, and diffusion preventing layer DB1, which are nitride semiconductor layers to be formed over the buffer layer BUF, with desired properties. As the buffer layer BUF, a nitride semiconductor layer made of gallium nitride (GaN), aluminum gallium nitride (AlGaN) or aluminum nitride (AlN), or a film stack obtained by stacking them may be used. When the substrate SUB is a gallium nitride substrate, the crystallinity of the channel layer CH, the barrier layer BR, and the diffusion preventing layer DB1 can be kept without using the buffer layer BUF so that insertion of the buffer layer BUF between the substrate SUB and the channel layer CH is not required.

The buffer layer BUF has thereon the channel layer CH. The channel layer CH is made of a nitride semiconductor layer, preferably gallium nitride (GaN). Gallium nitride configuring the channel layer CH is preferably undoped gallium nitride, that is, gallium nitride (i-GaN) in intrinsic state showing neither n type conductivity nor p type conductivity. This means that the conductivity of gallium nitride configuring the channel layer CH is neither an n type nor a p type. In other words, gallium nitride configuring the channel layer CH is neither an n type semiconductor nor a p type semiconductor. Undoped gallium nitride embraces gallium nitride which has grown while not subjected to doping intentionally. In another mode, the channel layer CH may be made of a nitride semiconductor layer such as indium gallium nitride (InGaN).

The terms "semiconductor shows n type conductivity", "the conductivity of a semiconductor is an n type", and "is an n type semiconductor" mean that the majority carriers in the semiconductor are electrons. The terms "semiconductor shows p type conductivity", "the conductivity of a semiconductor is a p type", and "is a p type semiconductor" mean that the majority carriers in the semiconductor are holes.

When a semiconductor has therein both electrons and holes as carriers, a difference in electron concentration and hole concentration is an effective carrier concentration. The term "the majority carriers are electrons" as used herein means that the electron concentration is greater than the hole concentration and at the same time, the effective carrier concentration is greater than $1 \times 10^{15}$ cm$^{-3}$. The term "the majority carriers are holes" means that the hole concentration is greater than the electron concentration and at the same time, the effective carrier concentration is greater than $1 \times 10^{15}$ cm$^{-3}$.

The term "intrinsic state" means that the electron concentration and the hole concentration are almost equal or neither electrons nor holes are generated as carriers. The term "intrinsic state" as used herein means a state in which an effective carrier concentration is not greater than $1 \times 10^{15}$ cm$^{-3}$.

The channel layer CH has thereon the barrier layer BR. The barrier layer BR is made of a nitride semiconductor layer different from the nitride semiconductor layer configuring the channel layer CH, for example, a nitride semiconductor layer having a band gap different from that of the channel layer CH. The band gap of the barrier layer BR is preferably greater than that of the channel layer CH.

When a nitride semiconductor layer made of gallium nitride (GaN) is used as the channel layer CH, a nitride semiconductor layer made of aluminum gallium nitride (AlGaN) is preferably used as the barrier layer BR. When a nitride semiconductor layer made of indium gallium nitride (InGaN) is used as the channel layer CH, a nitride semiconductor layer made of gallium nitride or aluminum gallium nitride is preferably used as the barrier layer BR.

The barrier layer BR lies on the channel layer while being in direct contact therewith and the channel layer CH and the barrier layer have therebetween a heterojunction in which a conduction band shows a discontinuous change at the interface. The barrier layer BR is an electron supply layer and can function as a carrier generation region.

The barrier layer BR may have an n type impurity such as silicon (Si) introduced therein.

The barrier layer BR has thereon the diffusion preventing layer DB1. The diffusion preventing layer DB1 is a nitride semiconductor layer containing aluminum (Al) and it is a nitride semiconductor layer made of, for example, aluminum gallium nitride (AlGaN). As will be described later, when a nitride semiconductor layer having a p type impurity made of magnesium (Mg) introduced therein is used as the cap layer CP, the diffusion preventing layer can suppress diffusion of the p type impurity introduced in the cap layer CP to the barrier layer BR or layers lying below the barrier layer BR.

This is presumed to occur, for example, because with an increase in the aluminum composition ratio of the diffusion preventing layer DB1 which is a nitride semiconductor layer made of aluminum gallium nitride, the lattice constant of aluminum gallium nitride configuring the diffusion preventing layer DB1 becomes small and interferes with the diffusion of magnesium which is a p type impurity.

The term "aluminum composition ratio" of the nitride semiconductor layer made of aluminum gallium nitride means a ratio of the number of aluminum atoms to the total number of gallium and aluminum atoms.

Since the diffusion preventing layer DB1 has an n type impurity introduced therein, the diffusion preventing layer DB1 shows n type conductivity. This means that the conductivity of the diffusion preventing layer DB1 is an n type and the diffusion preventing layer DB1 is an n type semiconductor layer. When the diffusion preventing layer DB1 is made of, for example, aluminum gallium nitride (AlGaN), for example, silicon (Si) can be introduced into the diffusion preventing layer DB1 as an n type impurity, that is, a donor. In such a case, when the cap layer CP which will be described later has magnesium (Mg) introduced therein as a p type impurity, that is, an acceptor, the diffusion preventing layer can further suppress diffusion of the p type impurity introduced into the cap layer CP to the barrier layer BR or layers lying below the barrier layer BR.

This is presumed to occur because, for example, in a region of the diffusion preventing layer DB1 in which silicon has been introduced, hydrogen does not diffuse smoothly and this difficulty in diffusion of hydrogen interferes with diffusion of magnesium. Described specifically, when the diffusion preventing layer DB1 has an n type impurity, that is, a donor introduced therein, the n type impurity having a positive charge hinders hydrogen from entering the diffusion preventing layer DB1 and as a result, magnesium easy to bond with hydrogen is, together with hydrogen, suppressed from diffusing in the diffusion preventing layer DB1.

When the barrier layer BR has an n type impurity introduced therein, preferably, the concentration of the n type impurity in the diffusion preventing layer DB1 is greater than that of the n type impurity in the barrier layer BR. This can further enhance the effect of suppressing diffusion of the p type impurity introduced in the cap layer CP compared with the case where the diffusion preventing layer DB1 is not formed.

Moreover, when the cap layer CP is formed by etching a semiconductor layer SL, for example, by dry etching as described later referring to FIG. 12, using a nitride semiconductor layer made of aluminum gallium nitride as the diffusion preventing layer DB1 makes it possible to stop the etching at the upper surface of the diffusion preventing layer DB1 with good selectivity. This makes it possible to prevent or suppress the thickness of the diffusion preventing layer DB1 from decreasing in a region between the gate electrode GE and the drain electrode DE and between the gate electrode GE and the source electrode SE. As a result, an increase in access resistance between the source electrode SE and the gate electrode GE and access resistance between the drain electrode DE and the gate electrode GE can be suppressed.

Preferably, when a nitride semiconductor layer made of aluminum gallium nitride is used as the barrier layer BR and a nitride semiconductor layer made of aluminum gallium nitride is used as the diffusion preventing layer DB1, an aluminum composition ratio of the diffusion preventing layer DB1 is greater than an aluminum composition ratio of the barrier layer BR. When a nitride semiconductor layer made of gallium nitride is used as the barrier layer BR and a nitride semiconductor layer made of aluminum gallium nitride as the diffusion preventing layer DB1, on the other hand, the aluminum composition ratio of the barrier layer Br becomes zero. This means that the barrier layer BR preferably contains aluminum at a composition ratio smaller than the aluminum composition ratio of the diffusion preventing layer DB1 or contains no aluminum.

When the cap layer CP has magnesium (Mg) introduced therein as a p type impurity, the p type impurity introduced into the cap layer CP can be suppressed surely from diffusing to the barrier layer BR or layers below the barrier layer BR.

The diffusion preventing layer DB1 has thereon the source electrode SE and the drain electrode DE. The source electrode SE and the drain electrode DE are each made of a conductor, for example, a metal film MF2 such as film stack of a titanium (Ti) film and a gold (Au) film formed on the titanium film. The source electrode SE and the drain electrode DE extend in a direction substantially perpendicular to the paper surface of FIG. 1. The source electrode SE and the drain electrode DE are in an ohmic contact with the diffusion preventing layer DB1.

The source electrode SE and the drain electrode DE are separated from each other and they are in partial regions on the diffusion preventing layer DB1, respectively so as to sandwich the gate electrode GE therebetween. This means that the gate electrode GE, the source electrode SE, and the drain electrode DE are separated from each other in a planar view. The term "in a planar view" means "when viewed from a direction perpendicular to the upper surface of the substrate SUB".

The barrier layer BR has thereon the diffusion preventing layer DB1 and the diffusion preventing layer DB1 has thereon the source electrode SE and the drain electrode DE while being separated from each other so that the barrier layer BR has thereon the source electrode SE and the drain electrode DE via the diffusion preventing layer DB1. This means that the barrier layer BR and the source electrode SE have therebetween the diffusion preventing layer DB1 and the barrier layer BR and the drain electrode DE have therebetween the diffusion preventing layer DB1.

A region of the diffusion layer DB1 sandwiched between the source electrode SE and the drain electrode DE has thereon the cap layer CP separated from each of the source electrode SE and the drain electrode DE. This means that the barrier layer BR has thereon the cap layer CP via the diffusion preventing layer DB1 and the barrier layer BR and the cap layer CP have therebetween the diffusion preventing layer DB1. Details of the cap layer CP will be described later.

The cap layer CP has thereon the gate electrode GE. The gate electrode GE is made of a conductor, for example, a metal film such as a film stack of a nickel (Ni) film and a gold (Au) film formed on the nickel film. The gate electrode GE extends in a direction substantially perpendicular to the paper surface of FIG. 1.

The gate electrode GE lies between the source electrode SE and the drain electrode DE in a planar view. This means that in a planar view, the gate electrode GE has been sandwiched between the source electrode SE and the drain electrode DE. In other words, the source electrode SE and the drain electrode DE separated from each other lie on the barrier layer BR via the diffusion preventing layer DB1 and the barrier layer BR sandwiched between the source electrode SE and the drain electrode DE has thereon the gate electrode GE via the diffusion preventing layer DB1 and the cap layer CP.

The gate electrode GE has preferably a Schottky junction with the cap layer CP. This hinders an electric current from crossing the Schottky barrier and flowing between the gate electrode GE and the cap layer CP so that a gate leakage current can be reduced.

In First Embodiment, the cap layer CP has a p type impurity introduced therein so that the cap layer CP shows p type conductivity. This means that the conductivity of the cap layer CP is a p type and the cap layer CP is a p type semiconductor layer. Adjusting the thickness and the impurity concentration of each of the cap layer CP and the barrier layer BR enables the resulting semiconductor device to operate as a normally-off type HEMT, that is, a field effect transistor.

The cap layer CP is preferably a p type nitride semiconductor layer made of gallium nitride (GaN). The cap layer CP has, for example, magnesium (Mg) introduced therein as the p type impurity.

Preferably, the cap layer CP is a p type nitride semiconductor layer containing aluminum (Al) and it is, for example, a nitride semiconductor layer made of aluminum gallium nitride (AlGaN). Also in this case, the cap layer CP has, for example, magnesium (Mg) introduced therein as the p type impurity. Since the cap layer CP made of gallium nitride contains aluminum (Al), the lattice constant decreases as in the case of the diffusion preventing layer DB1 to interfere with the diffusion of magnesium, which is a p type impurity. Diffusion of the p type impurity to the barrier layer BR can therefore be prevented during heat treatment.

More preferably, an aluminum composition ratio of the aluminum-containing cap layer CP increases from an interface IF1 between the cap layer CP and the gate electrode GE to an interface IF2 between the cap layer CP and the diffusion preventing layer DB1. This interferes with the diffusion of magnesium as a p type impurity in a portion of the cap layer CP near the diffusion preventing layer DB1, that is, near the barrier layer BR so that diffusion of the p type impurity to the barrier layer BR can be prevented surely during heat treatment.

<First Modification Example of Cap Layer>

Figure 2:
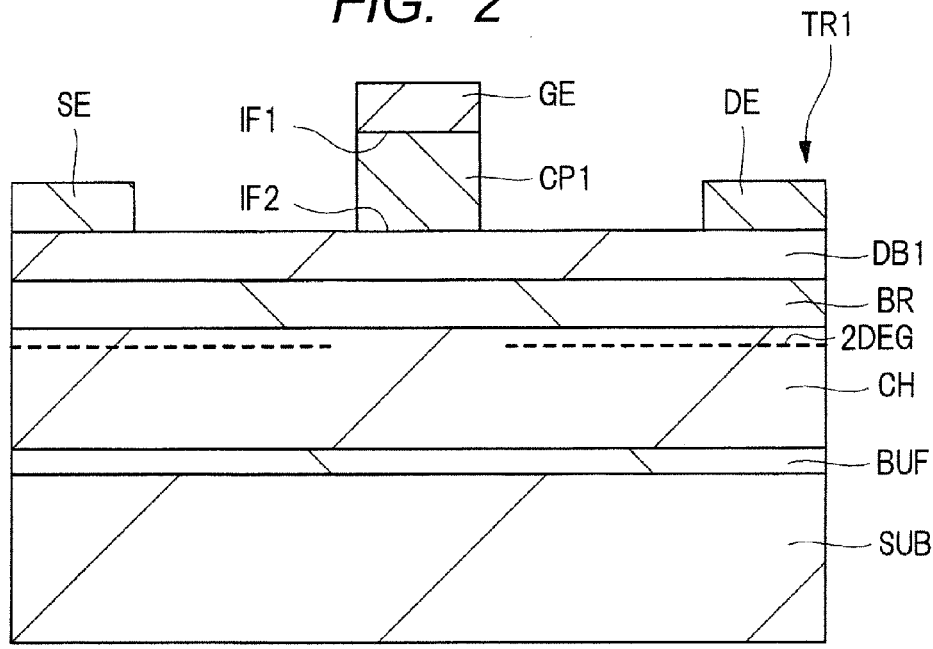
FIG. 2 is a fragmentary cross-sectional view of a semiconductor device according to a first modification example of First Embodiment.

FIG. 2 is a fragmentary cross-sectional view of a semiconductor device according to a first modification example of First Embodiment.

The semiconductor device of the first modification example is different from the semiconductor device of First Embodiment described above referring to FIG. 1 in that the cap layer CP of First Embodiment having, for example, magnesium (Mg) introduced therein as a p type impurity is replaced with a cap layer CP1 having carbon (C) introduced therein as the p type impurity. Each member of the semiconductor device of the first modification example is similar to that of the semiconductor device of First Embodiment except for the cap layer CP1.

The cap layer CP1 is, similar to the cap layer CP of First embodiment, is a nitride semiconductor layer made of, for example, gallium nitride (GaN) or aluminum gallium nitride (AlGaN) and it is a p type semiconductor layer. As described above, the cap layer CP1 has carbon (C) introduced therein as the p type impurity.

The diffusion coefficient of carbon (C) (which will hereinafter be called "carbon diffusion coefficient" simply) in the nitride semiconductor layer is smaller than the diffusion coefficient of magnesium (Mg) (which will hereinafter be called "magnesium diffusion coefficient" simply) in the nitride semiconductor layer. Using carbon instead of magnesium as the p type impurity therefore makes it possible to prevent diffusion of the p type impurity to the barrier layer BR more surely during heat treatment.

In this first modification example, carbon is given as an example of the p type impurity having a diffusion coefficient smaller than that of magnesium. Such a p type impurity is not limited to carbon and any p type impurity is usable insofar it has a diffusion coefficient smaller than that of magnesium in a nitride semiconductor layer and the nitride semiconductor layer configuring the cap layer shows a p type conductivity (which will equally apply to a second modification example and a third modification example).

<Second Modification Example of Cap Layer>

Figure 3:
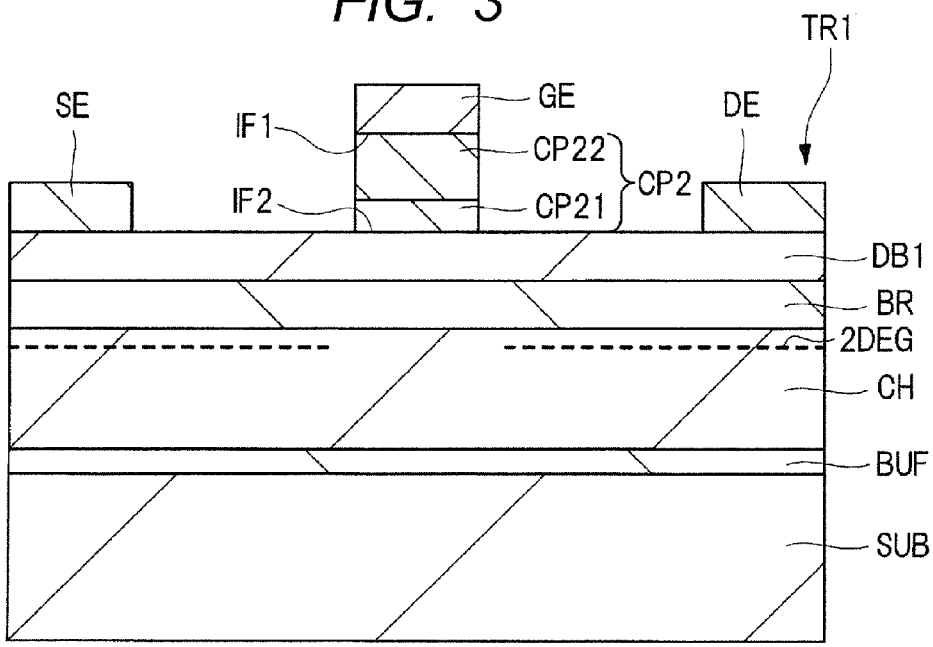
FIG. 3 is a fragmentary cross-sectional view of a semiconductor device according to a second modification example of First embodiment.

FIG. 3 is a fragmentary cross-sectional view of a semiconductor device according to a second modification example of First embodiment.

The semiconductor device of the second modification example is different from the semiconductor device of First Embodiment described above referring to FIG. 1 in that the cap layer CP of First Embodiment is replaced with a cap layer CP2. Each member of the semiconductor device of the second modification example is similar to that of the semiconductor device of First Embodiment except for the cap layer CP2.

The cap layer CP2 includes a cap layer CP21 and a cap layer CP22. The cap layer CP21 lies on the diffusion preventing layer DB1 sandwiched between the source electrode SE and the drain electrode DE. The cap layer CP22 lies on the cap layer CP21. The cap layer CP22 has thereon the gate electrode GE. This means that the cap layer CP2 is a stack of two cap layers, that is, the cap layer CP21 which is a lower layer and the cap layer CP22 which is an upper layer.

The cap layer CP21 and the cap layer CP22, that is, the cap layer CP2, is, similar to the cap layer CP of First Embodiment, is a nitride semiconductor layer made of, for example, gallium nitride (GaN) or aluminum gallium nitride (AlGaN) and it is a p type semiconductor layer. The cap layer CP21 has carbon (C) introduced therein as a p type impurity. The cap layer CP22 has magnesium (Mg) introduced therein as a p type impurity.

As described above in the first modification example, the carbon diffusion coefficient is smaller than the magnesium diffusion coefficient. Placing the cap layer CP21, in which carbon having a diffusion coefficient smaller than the magnesium diffusion coefficient has been introduced, as a lower layer of the cap layer CP2, in other words, placing it so as to be in contact with the diffusion preventing layer DB1 makes it possible to more surely prevent the p type impurity from diffusing to the barrier layer BR during heat treatment.

<Third Modification Example of Cap Layer>

Figure 4:
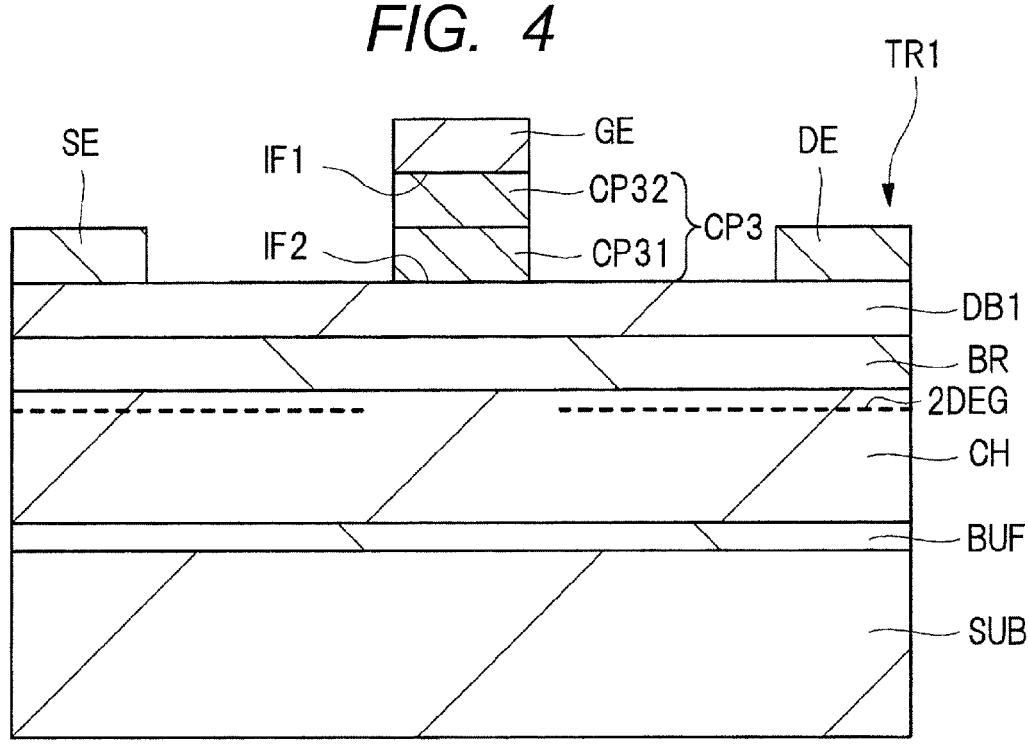
FIG. 4 is a fragmentary cross-sectional view according to a third modification example of First Embodiment.
Figure 5:
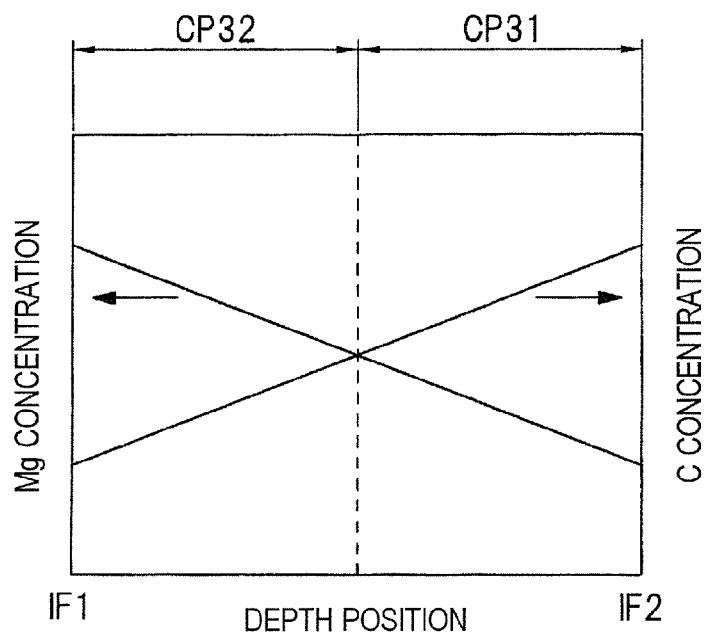
FIG. 5 is a graph schematically showing the depth direction distribution of the concentration of an impurity in a cap layer.

FIG. 4 is a fragmentary cross-sectional view of a semiconductor device according to a third modification example of First Embodiment. FIG. 5 is a graph schematically showing the depth direction distribution of the concentration of an impurity in a cap layer. In FIG. 5, the depth position between the interface IF1 and the interface IF2 is plotted along the abscissa of FIG. 5, the concentration of magnesium (Mg) is plotted along the left ordinate of FIG. 5, and the concentration of carbon (C) is plotted along the right ordinate of FIG. 5.

The semiconductor device of the third modification example is different from the semiconductor device of First Embodiment described above referring to FIG. 1 in that the cap layer CP of First Embodiment is replaced with a cap layer CP3. Each member of the semiconductor device of the third modification example is similar to that of the semiconductor device of First Embodiment except for the cap layer CP3.

The cap layer CP3 is, similar to the cap layer CP in First Embodiment, a nitride semiconductor layer made of, for example, gallium nitride (GaN) or aluminum gallium nitride (AlGaN) and it is a p type semiconductor layer. The cap layer CP3 has magnesium (Mg) and carbon (C) introduced therein as the p type impurity. As shown in FIG. 5, the concentration of magnesium (Mg) in the cap layer CP3 decreases from the interface IF1 between the cap layer CP3 and the gate electrode GE to the interface IF2 between the cap layer CP3 and the diffusion preventing layer DB1. The concentration of carbon (C) in the cap layer CP3 increases from the interface IF1 between the cap layer CP3 and the gate electrode GE to the interface IF2 between the cap layer CP3 and the diffusion preventing layer DB1.

The magnesium in the cap layer CP3 therefore shows the maximum concentration at the interface IF1 between the cap layer CP3 and the gate electrode GE and the minimum concentration at the interface IF2 between the cap layer CP3 and the diffusion preventing layer DB1. On the other hand, the carbon in the cap layer CP3 shows the minimum concentration at the interface IF1 between the cap layer CP3 and the gate electrode GE and the maximum concentration at the interface IF2 between the cap layer CP3 and the diffusion preventing layer DB1.

A ratio of the concentration of carbon to the concentration of magnesium in the cap layer CP3 increases from the interface IF1 between the cap layer CP3 and the gate electrode GE to the interface IF2 between the cap layer CP3 and the diffusion preventing layer DB1. This means that a ratio of the concentration of carbon to the concentration of magnesium in the cap layer CP3 shows the minimum value at the interface IF1 between the cap layer CP3 and the gate electrode GE and the maximum value at the interface IF2 between the cap layer CP3 and the diffusion preventing layer DB1.

Preferably, as shown in FIG. 5, the concentration of carbon is greater than the concentration of magnesium in the cap layer CP31 which is a lower layer portion of the cap layer CP3, while the concentration of carbon is smaller than the concentration of magnesium in the cap layer CP32 which is an upper layer portion of the cap layer CP3. At this time, the cap layer CP31 lies on the diffusion preventing layer DB1 sandwiched between the source electrode SE and the drain electrode DE and the cap layer CP32 lies on the cap layer CP31. The cap layer CP32 has thereon the gate electrode GE.

As described above in the first modification example, the carbon diffusion coefficient is smaller than the magnesium diffusion coefficient. Maximizing the concentration of carbon having a diffusion coefficient smaller than that of magnesium in a portion of the cap layer CP3 in contact with the diffusion preventing layer DB1, diffusion of the p type impurity to the barrier layer BR can be prevented more surely during heat treatment.

<Operation of Semiconductor Device>

The operation of the semiconductor device of First Embodiment will next be described. The semiconductor device operates as a normally-off type device because it has a cap layer CP, which will be described herein.

In the transistor TR1 as HEMT shown in FIG. 1, a secondary electron gas 2DEG is formed in the channel layer CH in the vicinity of the interface with the barrier layer BR. This means that the band gap of, for example, gallium nitride (GaN) configuring the channel layer CH is different from the band gap of, for example, aluminum gallium nitride (AlGaN) configuring the barrier layer BR. A potential well lower than the Fermi level is formed in the channel layer CH in the vicinity of the interface with the barrier layer BR due to a conduction band offset derived from the difference in band gap and influences of piezo polarization and voluntary polarization present in the barrier layer BR. As a result, electrons are accumulated in this potential well and a secondary electron gas 2DEG is formed in the channel layer in the vicinity of the interface with the barrier layer BR.

The source electrode SE and the drain electrode DE are each electrically coupled to this secondary electron gas 2DEG. In FIG. 1, the secondary electron gas 2DEG is schematically shown with a broken line.

The transistor TR1 as HEMT shown in FIG. 1 has the p type cap layer CP below the gate electrode GE so that the threshold voltage is positive, in other words, it can operate as a normally-off type device.

When the gate electrode GE lies on the barrier layer BR while being in direct contact therewith without the cap layer CP therebetween, the threshold voltage is negative, in other words, the resulting device operates as a normally-on type device. Power control transistors and the like are however required to be a normally-off type device so that it is desired to obtain a normally-off type device by using a structure having the p type cap layer CP below the gate electrode GE.

When a nitride semiconductor layer is used as the channel layer CH and the barrier layer BR, the energy at the bottom of the potential well decreases due to piezo polarization and voluntary polarization caused by using the nitride semiconductor layer as well as a difference, that is, offset of the conduction band between the channel layer CH and the barrier layer BR. When the gate electrode GE does not have therebelow the cap layer CP, therefore, a potential well having, at the bottom thereof, energy lower than the Fermi level is formed in the channel layer CH in the vicinity of the interface with the barrier layer BR. When no voltage is applied to the gate electrode GE, a secondary electron gas 2DEG is formed in the channel layer CH in the vicinity of the interface with the barrier layer BR. As a result, the semiconductor device as HEMT inevitably serves as a normally-on type device.

When the gate electrode GE has therebelow the p type cap layer CP as shown in FIG. 1, piezo polarization generated at the interface between the channel layer CH and the barrier layer BR can be offset with piezo polarization generated at the interface between the cap layer CP and the diffusion preventing layer DB1 so that energy of the conduction band of the barrier layer BR increases below the cap layer CP. In addition, due to a negative space charge generated by an acceptor (p type impurity) with which the cap layer CP has been doped, energy of the conduction band of the cap layer CP increases, which induces an increase also in energy of the conduction band of the barrier layer BR. As a result, when no voltage is applied to the gate electrode GE, formation of a secondary electron gas 2DEG in the channel layer CH below the gate electrode GE can be prevented. The transistor TR1 which is the semiconductor device of First Embodiment can therefore operate as a normally-off type device.

<Method of Manufacturing Semiconductor Device>

A method of manufacturing the semiconductor device of First Embodiment will next be described.

FIGS. 6 to 14 are fragmentary cross-sectional views of the semiconductor device of First Embodiment during manufacturing steps thereof.

Figure 6:
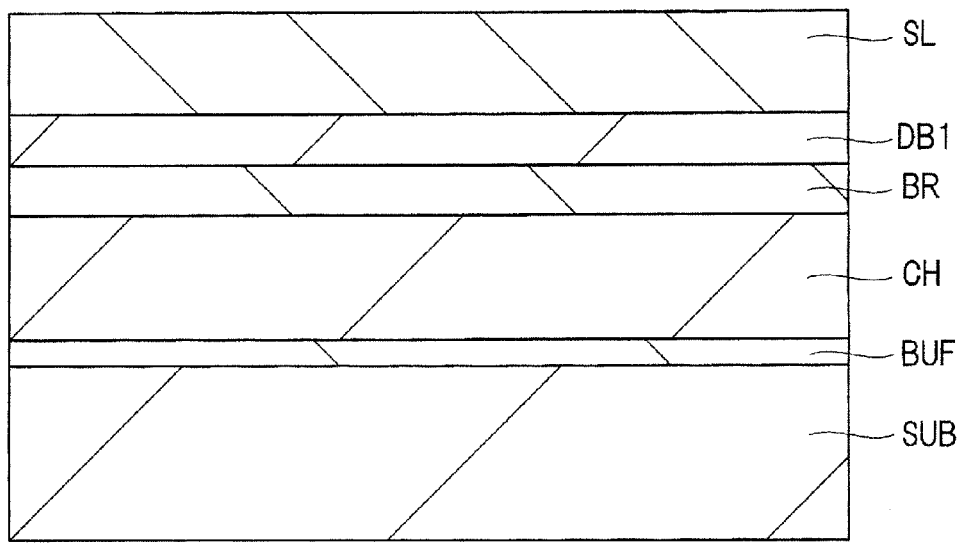
FIG. 6 is a fragmentary cross-sectional view of the semiconductor device according to First Embodiment during a manufacturing step thereof.

First, as shown in FIG. 6, a plurality of semiconductor layers are stacked one after another on a substrate SUB which is a semiconductor substrate made of, for example, silicon with an exposed (111) face by using, for example, metal organic chemical vapor deposition (MOCVD).

First, a buffer layer BUF made of undoped gallium nitride (GaN) is formed on the substrate SUB. The thickness of this buffer layer BUF can be set at, for example, about 1 μm.

Next, a channel layer CH which is a nitride semiconductor layer made of, for example, undoped gallium nitride (GaN) is formed on the buffer layer BUF by epitaxial growth. The thickness of this channel layer can be set at, for example, about 1 μm.

Next, a barrier layer BR which is a nitride semiconductor layer made of, for example, undoped aluminum gallium nitride (AlGaN) is formed on the channel layer CH by epitaxial growth. The thickness of the barrier layer BR can be set at, for example, about 14.5 nm.

Next, a diffusion preventing layer which is a nitride semiconductor layer made of, for example, aluminum gallium nitride (AlGaN) having an n type impurity introduced therein is formed on the barrier layer BR by epitaxial growth. The thickness of the diffusion preventing layer DB1 can be set at, for example, about 3 nm.

Next, a semiconductor layer SL which is a nitride semiconductor layer made of, for example, gallium nitride (p type GaN) having a p type impurity introduced therein is formed on the diffusion preventing layer DB1. The semiconductor layer SL will be the cap layer CP (refer to FIG. 1). The thickness of the semiconductor layer SL can be set at, for example, about 32 nm. As the p type impurity, for example, magnesium (Mg) can be used. In this case, the semiconductor layer SL can be formed, for example, by MOCVD using a raw material gas containing magnesium.

Thus, a semiconductor layer structure comprised of the buffer layer BUF, channel layer CH, barrier layer BR, diffusion preventing layer DB1 and semiconductor layer SL is formed on the substrate SUB. This semiconductor layer structure is formed by the growth of a group III face stacked in the [0001] crystal axis (C axis) direction.

In each of the semiconductor layers configuring the above-mentioned semiconductor layer structure, a polarization charge is generated at the upper and lower interfaces of each of the semiconductor layers based on spontaneous polarization and piezo polarization. In the case of the growth of a group III face, the polarity of the polarization charge is negative on the surface side and positive on the back side.

Figure 7:
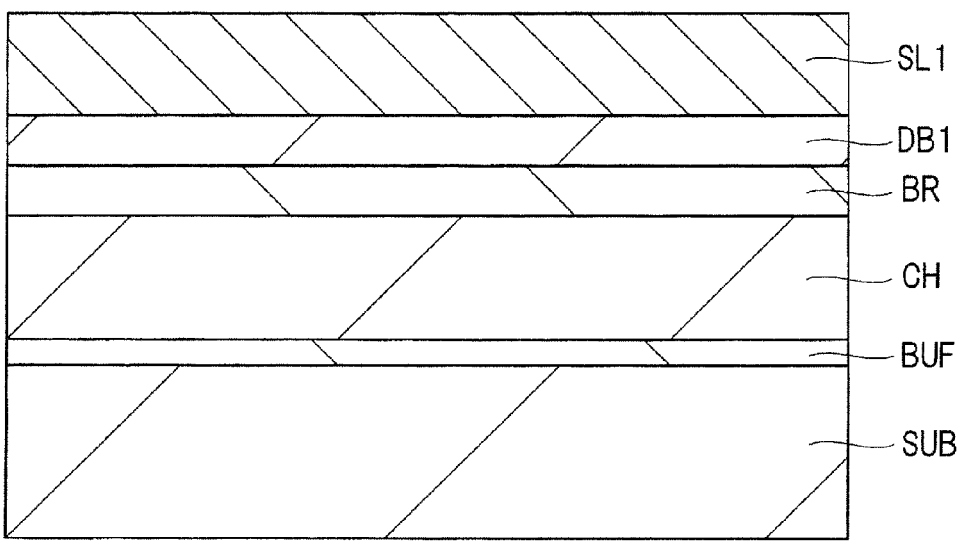
FIG. 7 is a fragmentary cross-sectional view of the semiconductor device according to First Embodiment during another manufacturing step thereof.

As shown in FIG. 7, after formation of the diffusion preventing layer DB1, a semiconductor layer SL1 made of gallium nitride (p type GaN) having a p type impurity introduced therein can be formed, for example, by MOCVD using a raw material gas containing carbon (C). By this method, as shown in FIG. 7, the semiconductor layer SL1 which will be the cap layer CP1 (refer to FIG. 2) of the semiconductor device of the first modification example of First Embodiment can be formed on the diffusion preventing layer DB1 instead of the semiconductor layer SL (refer to FIG. 6).

Figure 8:
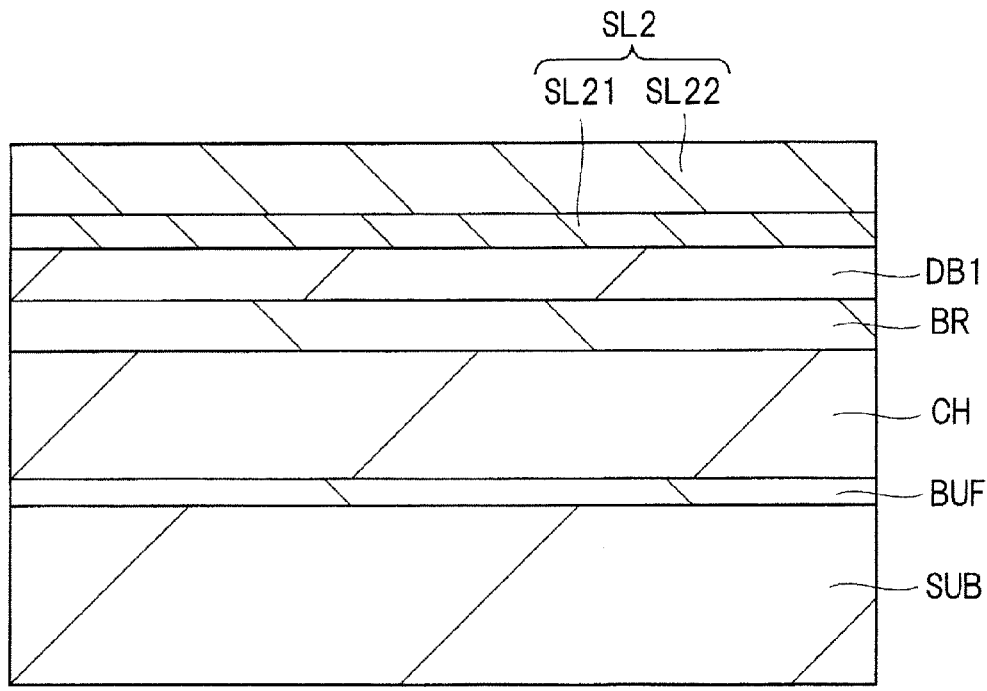
FIG. 8 is a fragmentary cross-sectional view of the semiconductor device according to First Embodiment during another manufacturing step thereof.

As shown in FIG. 8, it is possible to form, after formation of the diffusion preventing layer DB1, a semiconductor layer SL21 made of p type GaN, for example, by MOCVD using a raw material gas containing carbon (C) and then, form a semiconductor layer SL22 made of p type GaN, for example, by MOCVD using, instead of the above-mentioned gas, a raw material gas containing magnesium (M). By the method as described above, as shown in FIG. 8, a semiconductor layer SL2 which will be the cap layer CP2 (refer to FIG. 3) of the semiconductor device of the second modification example of First Embodiment can be formed on the diffusion preventing layer DB1 instead of the semiconductor layer SL (refer to FIG. 6). The semiconductor layer SL2 is comprised of the semiconductor layer SL21 having carbon introduced therein as a p type impurity and the semiconductor layer SL22 having magnesium introduced therein as a p type impurity. The semiconductor layer SL22 is formed on the semiconductor layer SL21.

Figure 9:
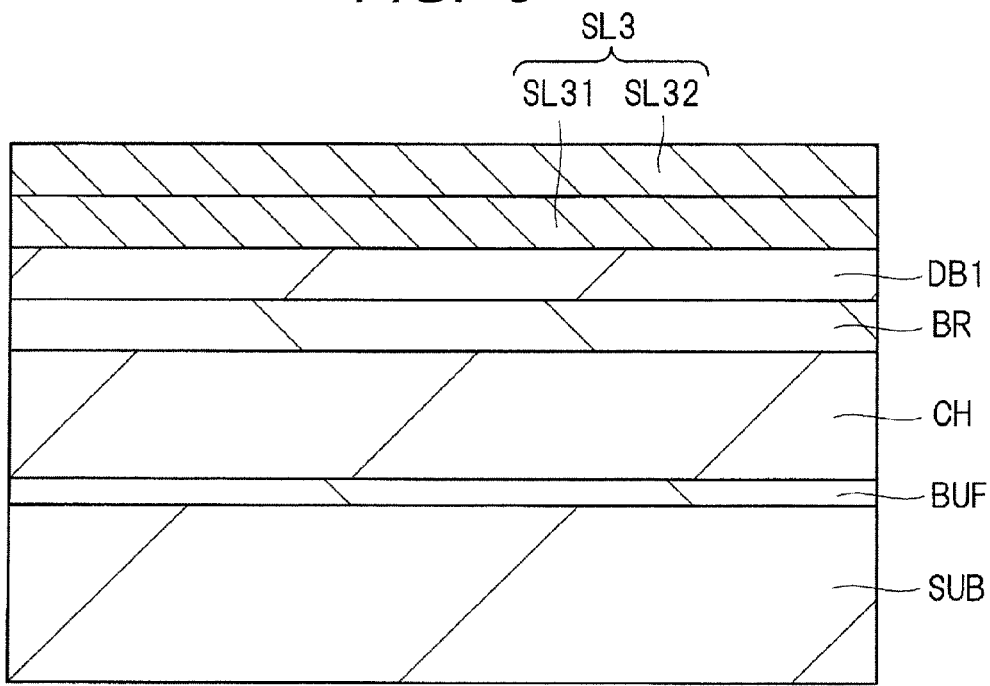
FIG. 9 is a fragmentary cross-sectional view of the semiconductor device according to First Embodiment during another manufacturing step thereof.

As shown in FIG. 9, after formation of the diffusion preventing layer DB1, a semiconductor layer SL3 made of p type GaN can be formed, for example, by MOCVD using a raw material gas obtained by mixing a first gas containing carbon (C) and a second gas containing magnesium (Mg). During from the start point of the formation of the semiconductor layer LS3 to the end point, the mixing ratio of the second gas to the first gas can be increased. By using such a method, as shown in FIG. 9, a semiconductor layer SL31 which has a carbon concentration greater than a magnesium concentration and will be the cap layer CP31 (refer to FIG. 4) of the semiconductor device of the third modification example of First Embodiment can be formed on the diffusion preventing layer DB1. On the other hand, a semiconductor layer SL32 which has a carbon concentration smaller than a magnesium concentration and will be the cap layer CP32 (refer to FIG. 4) of the semiconductor device of the third modification example of First Embodiment can be formed on the semiconductor layer SL31. Thus, the semiconductor layer SL3 comprised of the semiconductor layer SL31 and the semiconductor layer L32 can be formed.

Figure 10:
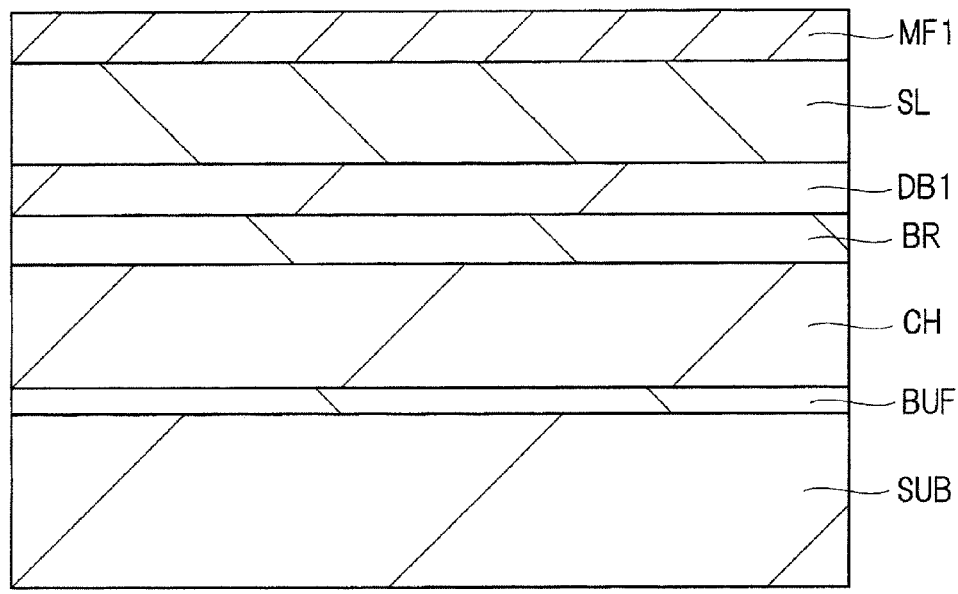
FIG. 10 is a fragmentary cross-sectional view of the semiconductor device according to First Embodiment during another manufacturing step thereof.

Next, as shown in FIG. 10, a metal film MF1 is formed on the semiconductor layer SL. The metal film MF1 contains, for example, a nickel (Ni) film formed on the semiconductor layer SL and a gold (Au) film formed on the nickel film. The metal film MF1 is formed, for example, using vapor deposition.

Next, a resist film is applied to the metal film MF1, followed by exposure and development treatment to pattern the resist film. The resist film is patterned so as to leave the resist film in a region in which the gate electrode GE (refer to FIG. 1) is to be formed. After etching of the metal film MF1 with the patterned resist film as a mask, the resist film is removed.

Figure 11:
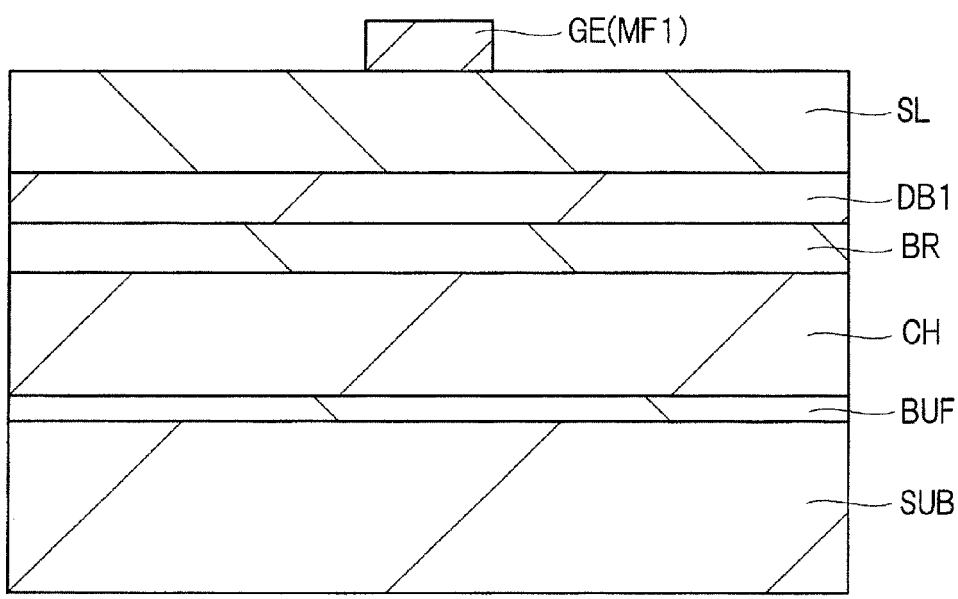
FIG. 11 is a fragmentary cross-sectional view of the semiconductor device according to First Embodiment during another manufacturing step thereof.

Thus, as shown in FIG. 11, the gate electrode GE made of the metal film MF1 is formed between a region in which the source electrode SE (refer to FIG. 1) is to be formed and a region in which the drain electrode DE (refer to FIG. 1) is to be formed.

Figure 13:
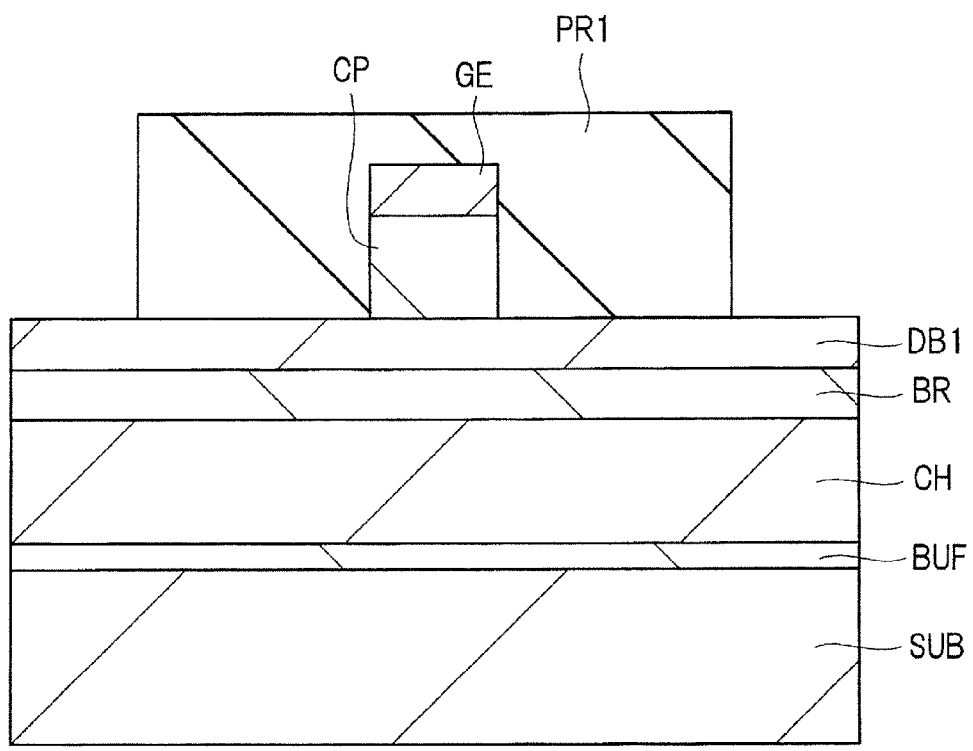
FIG. 13 is a fragmentary cross-sectional view of the semiconductor device according to First Embodiment during another manufacturing step thereof.

The gate electrode GE may be formed using, instead of the above-mentioned method, the lift-off process by conducting steps similar to those described later referring to FIGS. 13 and 14.

Figure 12:
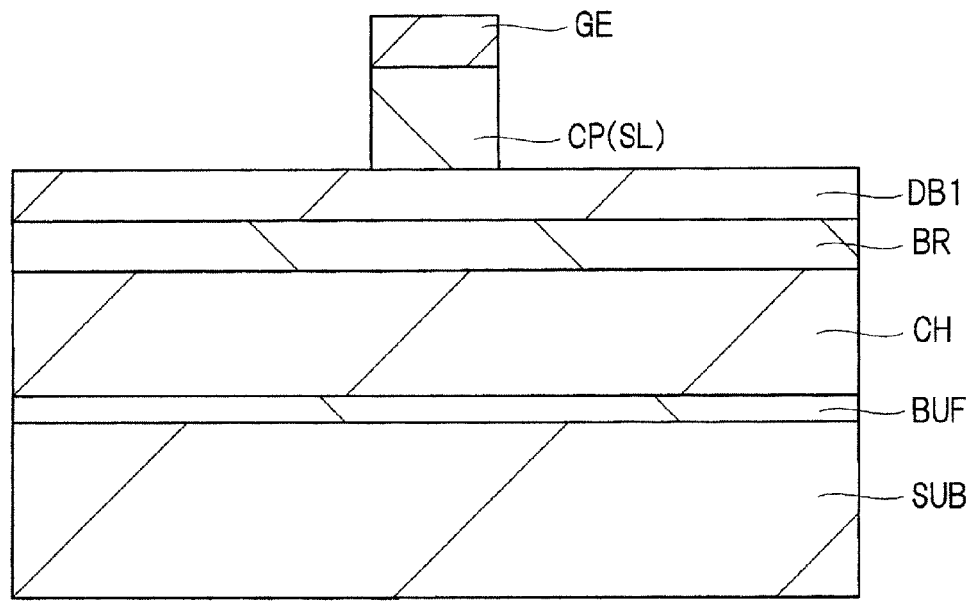
FIG. 12 is a fragmentary cross-sectional view of the semiconductor device according to First Embodiment during another manufacturing step thereof.

Next, as shown in FIG. 12, with the gate electrode GE as a mask, the semiconductor layer SL is etched to form a p type cap layer CP comprised of the semiconductor layer SL below the gate electrode GE. This means that the cap layer CP is formed below the gate electrode GE and at the same time, on the diffusion preventing layer DB1. More specifically, the semiconductor layer SL is etched, for example, by dry etching with an etching gas obtained by adding an oxygen ($O_2$) gas or sulfur hexafluoride ($SF_6$) gas to a chlorine ($Cl_2$) gas.

When the above-mentioned etching gas is used, an etching rate of the nitride semiconductor layer decreases with an increase in an aluminum composition ratio of the nitride semiconductor layer. In First Embodiment, the aluminum composition ratio of the diffusion preventing layer DB1 is greater than the aluminum composition ratio of the barrier layer BR so that the etching rate of the diffusion preventing layer DB1 is smaller than the etching rate of the barrier layer BR.

Accordingly, in First Embodiment, compared with the case where the diffusion preventing layer DB1 has not been formed, etching can be terminated with good selectivity at the upper surface of the diffusion preventing layer DB1 when the semiconductor layer SL is dry etched using, for example, the above-mentioned etching gas to form the cap layer CP. This makes it possible to prevent or suppress a decrease in the thickness of the diffusion preventing layer DB1 and the thickness of the barrier layer BR in a region between the gate electrode GE and the drain electrode DE and a region between the gate electrode GE and the source electrode SE, thereby preventing or suppressing an increase in the access resistance between the source electrode SE and the gate electrode GE and the access resistance between the drain electrode DE and the gate electrode GE.

Next, the source electrode SE (refer to FIG. 1) and the drain electrode DE (refer to FIG. 1) are formed on the diffusion preventing layer DB1 by using, for example, the lift-off process.

First, the resist film PR1 (refer to FIG. 13) is applied onto the gate diffusion preventing layer DB1 including the upper surface of the electrode GE, that is, the upper surface of the p type cap layer CP. The resulting resist film PR1 is then subjected to exposure and development treatment to pattern the resist film PR1 as shown in FIG. 13. The resist film PR1 is patterned so as to expose the diffusion preventing layer DB1 in the region where the source electrode SE (refer to FIG. 1) is to be formed and the region where the drain electrode DE (refer to FIG. 1) is to be formed.

Figure 14:
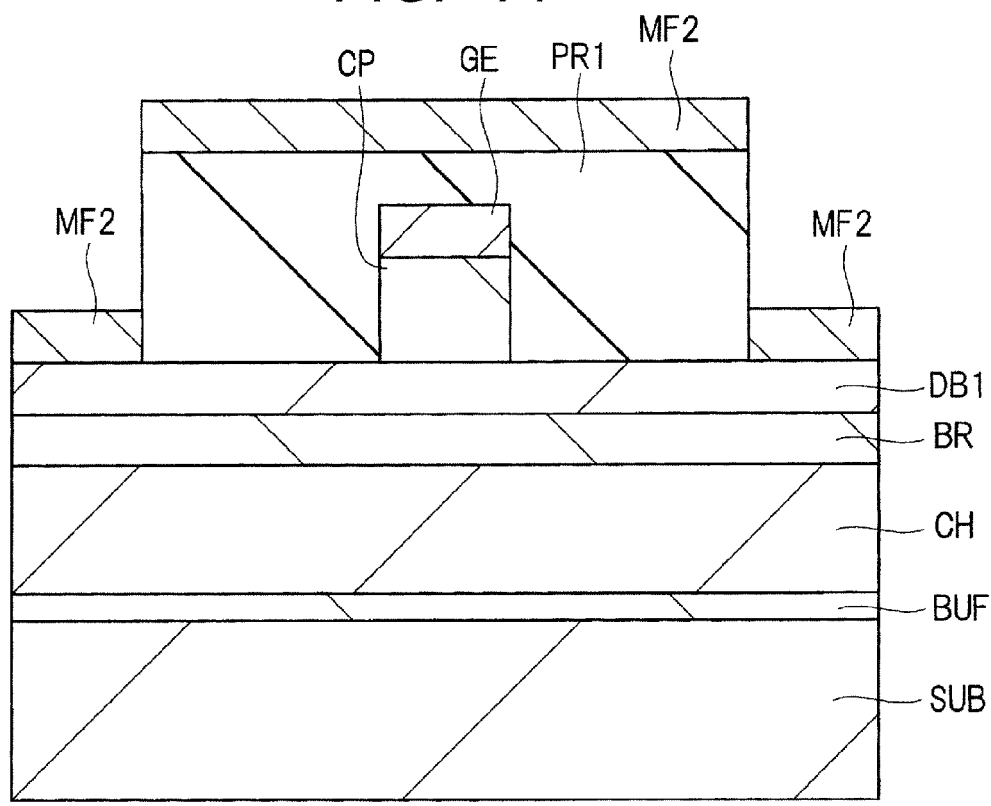
FIG. 14 is a fragmentary cross-sectional view of the semiconductor device according to First Embodiment during another manufacturing step thereof.

Then, as shown in FIG. 14, a metal film MF2 is formed. In the region where the source electrode SE (refer to FIG. 1) is to be formed and the region where the drain electrode DE (refer to FIG. 1) is to be formed, the metal film MF2 is formed directly on the diffusion preventing layer DB1. In the other region, on the other hand, the metal film MF2 is formed on the resist film PR1. The metal film MF2 contains, for example, a titanium (Ti) film and an aluminum (Al) film formed on the titanium film. This metal film MF2 can be formed, for example, vapor deposition.

Next, the resist film PR1 is lifted off. For example, the upper surface of the substrate SUB is washed with an organic solvent or the like to remove the resist film PR1 and the metal film MF2 formed on the resist film PR1, while leaving only the metal film MF2 formed on the diffusion preventing layer DB1 so as to be brought into direct contact therewith. As a result, as shown in FIG. 1, a source electrode SE and a drain electrode DE made of the metal film MF2 which is in direct contact with the diffusion preventing layer DB1 can be formed. The source electrode SE and the drain electrode DE are separated from each other on the diffusion preventing layer DB1 and the p type cap layer CP is therefore formed on a region of the diffusion preventing layer DB1 sandwiched between the source electrode SE and the drain electrode DE but separated from each of the source electrode SE and the drain electrode DE.

Next, the substrate SUB is subjected to heat treatment (alloy treatment) to ohmically couple the source electrode SE and the channel layer CH. Similarly, the drain electrode DE and the channel layer CH are ohmically coupled to each other by this heat treatment.

Then, although not illustrated, an element isolation region is formed by ion implantation using an ion such as nitrogen (N) in order to isolate between elements. In such a manner, the transistor TR1 as the semiconductor device of First Embodiment can be manufactured as shown in FIG. 1.

<Normally-Off Characteristics without Diffusion Preventing Layer>

Figure 15:
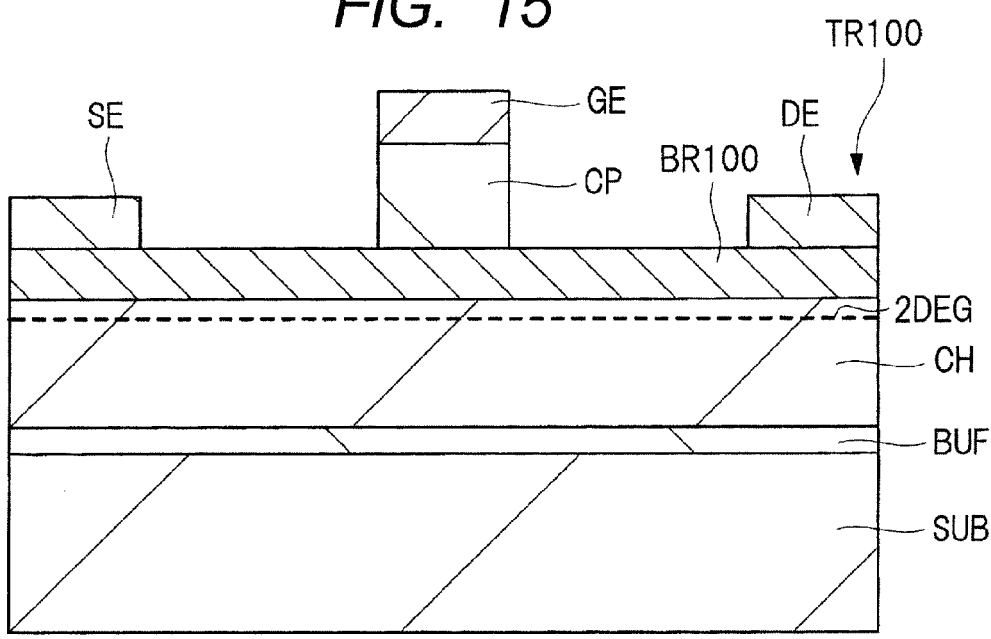
FIG. 15 is a fragmentary cross-sectional view of a semiconductor device according to Comparative Example 1.

FIG. 15 is a fragmentary cross-sectional view of a semiconductor device of Comparative Example 1.

As shown in FIG. 15, the semiconductor device of Comparative Example 1 is, similar to the semiconductor device of First Embodiment, equipped with a transistor TR100, which is an HEMT, as a field effect transistor. The transistor TR100 has, similar to the transistor TR1 of First Embodiment, a substrate SUB, a buffer layer BUF formed on the substrate SUB, a channel layer CH formed on the buffer layer BUF and made of a nitride semiconductor layer, and a barrier layer BR100 formed on the channel layer CH and made of a nitride semiconductor layer. The barrier layer BR100 is the same as the barrier layer BR of First Embodiment.

The transistor TR100 is however different from the transistor TR1 of First Embodiment and does not have the diffusion preventing layer DB1 (refer to FIG. 1) formed on the barrier layer BR100 and made of a nitride semiconductor layer.

In addition, the transistor TR100 is different from the transistor TR1 of First Embodiment in that it has, on the barrier layer BR100, the source electrode SE and the drain electrode DE separated from each other and the cap layer CP formed on the barrier layer BR100 sandwiched between the source electrode SE and the drain electrode DE. The transistor TR100 further has the gate electrode GE formed on the cap layer CP.

In short, the semiconductor device of Comparative Example 1 does not have the diffusion preventing layer DB1 (refer to FIG. 1) between the barrier layer BR100 and the cap layer CP. In addition, it does not have the diffusion preventing layer DB1 (refer to FIG. 1) between the barrier layer BR100 and each of the source electrode SE and the drain electrode DE.

Figure 16:
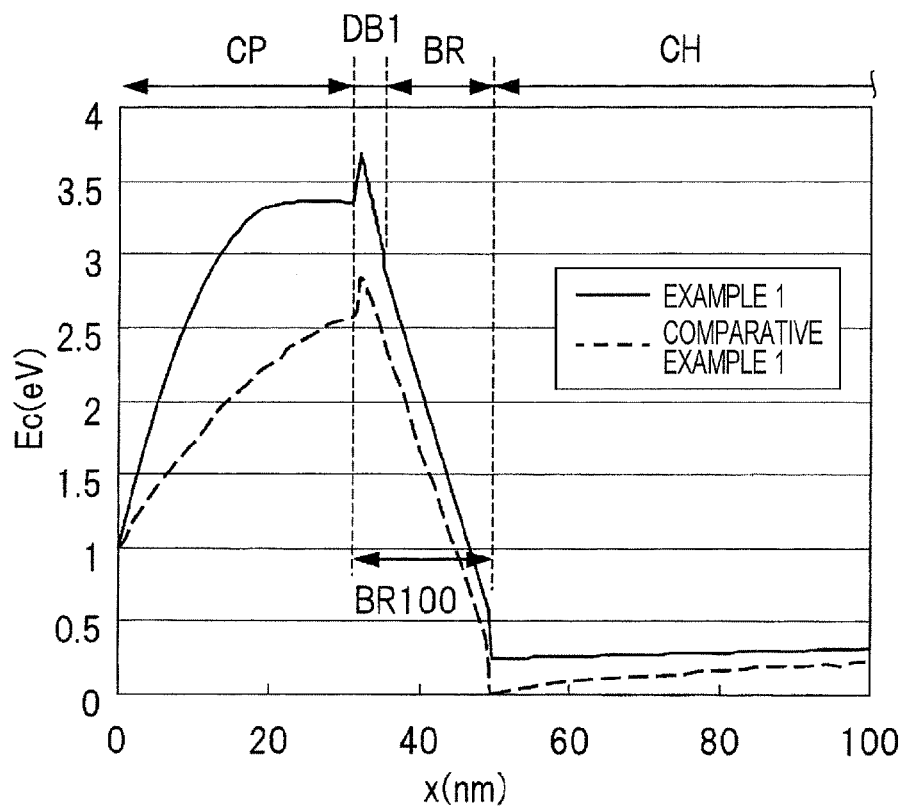
FIG. 16 shows the calculation results of an energy distribution of a conduction band below a gate electrode.

FIG. 16 shows the calculation results of energy distribution in a conduction band below the gate electrode. In FIG. 16, the depth x from the gate electrode GE is plotted along the abscissa, while the energy Ec of the conduction band at a Fermi level of 0 eV is plotted along the ordinate. The broken line in FIG. 16 shows the calculation results of the energy distribution in a conduction band below the gate electrode GE in the semiconductor device of Comparative Example 1, while the solid line in FIG. 16 shows the calculation results of the energy distribution in a conduction band below the gate electrode GE in the semiconductor device of Example 1, when the example of the semiconductor device of First Embodiment is designated as Example 1. It is to be noted that FIG. 16 shows the calculation results of energy distribution without applying a voltage to the gate electrode GE.

In the energy distribution of Comparative Example 1 shown in FIG. 16, a region having a depth x of from 0 to 32 nm corresponds to the cap layer CP, a region having a depth x of from 32 to 49.5 nm corresponds to the barrier layer BR100, and a region having a depth x of 49.5 nm or greater corresponds to the channel layer CH. This means that the thickness of the cap layer CP is set at 32 nm, the thickness of the barrier layer BR100 is set at 17.5 nm, and the thickness of the channel layer CH is set at 1 μm.

It is assumed that as a result of using a p type nitride semiconductor layer made of gallium nitride as the cap layer CP and diffusing the p type impurity introduced in the cap layer CP, the concentration of the p type impurity, that is, an acceptor in the cap layer CP decreases from $5 \times 10^{18}$ cm$^{-3}$ to $2 \times 10^{18}$ cm$^{-3}$. A nitride semiconductor layer made of aluminum gallium nitride is used as the barrier layer BR100, and its composition is $Al_{0.15}Ga_{0.85}N$, meaning that the aluminum composition ratio is 0.15, and the concentration of an n type impurity, that is, a donor in the barrier layer BR100 is $5 \times 10^{17}$ cm$^{-3}$. Further, a nitride semiconductor layer made of gallium nitride is used as the channel layer CH.

As shown in FIG. 16, in the energy distribution of Comparative Example 1, the energy in the conduction band of the channel layer CH decreases to the level near 0 eV substantially equal to the Fermi level at the interface between the barrier layer BR100 and the channel layer CH so that when no voltage is applied to the gate electrode GE, there is a possibility of the secondary electron gas 2DEG (refer to FIG. 15) being formed below the gate electrode GE and at the interface between the barrier layer BR100 and the channel layer CH. In other words, a channel for electrically coupling the source electrode SE and the drain electrode DE to each other may be formed and there is a possibility of failing to achieve normally-off characteristics.

This is presumed to occur because diffusion of magnesium (Mg) introduced in the cap layer CP as the p type impurity diffuses from the cap layer CP to the barrier layer BR100 to cause a decrease in the concentration of the p type impurity in the cap layer CP, a decrease in a negative space charge derived from the p type impurity (acceptor) in the cap layer CP, and a reduction in the energy in the conduction band of the cap layer CP, resulting in a reduction in the energy in the conduction band of the barrier layer BR100.

In the steps of manufacturing a semiconductor device equipped with HEMT as a field effect transistor, the semiconductor device during the manufacturing steps may be subjected to heat treatment such as annealing treatment for the above-mentioned ohmic coupling of the source electrode SE and the drain electrode DE or heat treatment for activating the p type impurity introduced.

In the semiconductor device of Comparative Example 1, the p type cap layer CP is in direct contact with the n type barrier layer BR100. The impurity introduced in each of the barrier layer BR100 and the cap layer CP diffuses by the heat treatment during the manufacturing steps, which may change the distribution of the impurity and hinder the semiconductor device from having desired characteristics.

For example, when the p type impurity introduced in the cap layer CP diffuses, the piezo polarization generated at the interface between the channel layer CH made of, for example, gallium nitride and the barrier layer BR100 made of, for example, n type aluminum gallium nitride cannot be offset by the piezo polarization generated at the interface between the barrier layer BR100 and the cap layer CP. Further, a decrease in negative space charge derived from the p type impurity in the cap layer CP causes a reduction in the energy in the conduction band of the cap layer CP, inducing a reduction in the energy in the conduction band of the barrier layer BR100. As a result, the energy in the conduction band of the barrier layer BR100 decreases below the cap layer CP and the energy at the bottom of the potential well at the interface between the channel layer CH and the barrier layer BR100 becomes lower than the Fermi level. As a result, without application of a voltage to the gate electrode GE, a current flows between the source electrode SE and the drain electrode DE, making it impossible to achieve desired normally-off characteristics.

Moreover, since the concentration of the n type impurity which has been introduced in the barrier layer BR100 is made up with the p type impurity diffused into the barrier layer BR100 from the p type cap layer CP, the concentration of the n type impurity in the barrier layer BR100 decreases. Or, with diffusion of the p type impurity, diffusion of the n type impurity occurs and the concentration of the n type impurity in the barrier layer BR100 decreases. This decreases the concentration of the carrier as a secondary electron gas, for example, between the gate electrode GE and the drain electrode DE or between the gate electrode GE and the source electrode SE and the on-resistance increases. Below the gate electrode GE, impurity diffusion occurs in the channel layer CH, causing a decrease in carrier mobility.

In the steps of manufacturing the semiconductor device equipped with HEMT as a field effect transistor, the cap layer CP is formed by etching. Except the case where a ratio of an etching rate of the cap layer CP to an etching rate of the barrier layer BR100, that is, an etch selectivity is sufficiently high, the thickness of the barrier layer BR100 may decrease as a result of etching of the barrier layer BR100 during etching of the cap layer CP. In such a case, access resistance between the source electrode SE or drain electrode DE and the gate electrode GE increases and the semiconductor device thus obtained has deteriorated performance.

Figure 17:
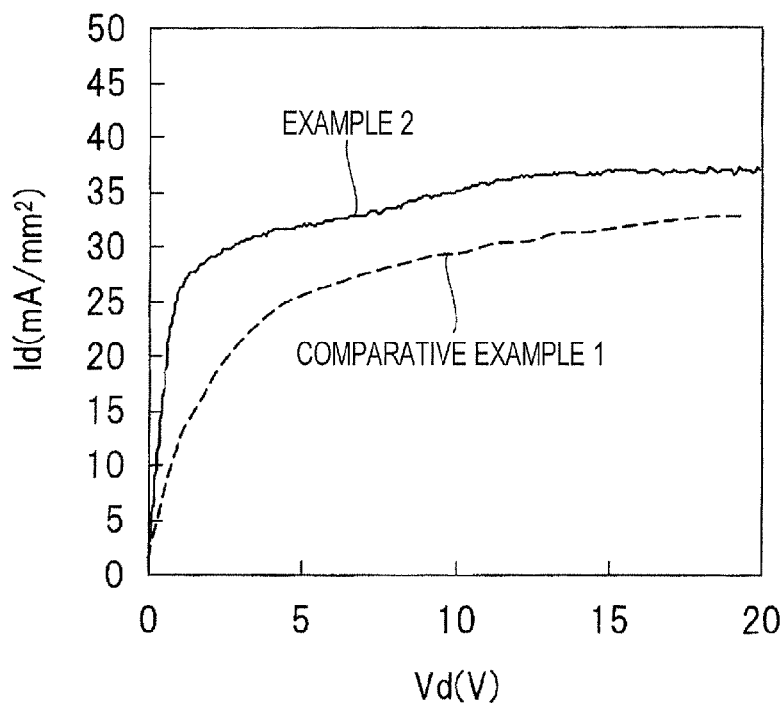
FIG. 17 is a graph showing the relationship between a drain voltage and a drain current.

FIG. 17 is a graph showing the relationship between a drain voltage and a drain current. In FIG. 17, a drain voltage Vd, that is, a voltage applied between the source electrode SE and the drain electrode DE is plotted along the abscissa, while a drain current Id, that is, a current flowing between the source electrode SE and the drain electrode DE is plotted along the ordinate. The broken line in FIG. 17 shows the relationship between the drain voltage Vd and the drain current Id in the semiconductor device of Comparative Example 1. The solid line in FIG. 17 shows, when an example of the semiconductor device of First Embodiment is designated as Example 2, the relationship between the drain voltage Vd and the drain current Id in the semiconductor device of Example 2.

As shown in FIG. 17, in an ON state, the drain current ID in Comparative Example 1 is smaller than the drain current Id in Example 2. This means that the on-resistance in Comparative Example 1 is greater than the on-resistance in Example 2 and a saturation current in Comparative Example 1 is smaller than a saturation current in Example 2. This is presumed to occur because as described above, in forming the cap layer CP by etching the semiconductor layer SL, the barrier layer BR100 is etched to have a decreased thickness.

Thus, in order to improve the performance of a semiconductor device having HEMT as a field effect transistor, it is important to suppress diffusion of a p type impurity and an n type impurity during heat treatment and in addition, suppress a decrease in the thickness of the barrier layer BR100 caused by etching in the manufacturing steps of the semiconductor device.

The semiconductor device of Comparative Example 1 however has deteriorated performance because, in the manufacturing steps thereof, diffusion of a p type impurity and an n type impurity between the cap layer CP and the barrier layer BR100 and a decrease in the thickness of the barrier layer BR100 cannot be suppressed.

<Characteristics and Advantages of Present Embodiment>

The semiconductor device of First Embodiment has the diffusion preventing layer DB1 between the barrier layer BR and the cap layer CP. The diffusion preventing layer DB1 is made of a nitride semiconductor layer containing aluminum (Al). This makes it possible, in manufacturing steps, to suppress the diffusion of a p type impurity from the cap layer CP to the barrier layer BR and a decrease in the thickness of the barrier layer BR. In addition to the suppression of the diffusion of the p type impurity, it can also suppress the diffusion of the n type impurity. As a result, the semiconductor device thus obtained can have improved performance.

Preferably, the diffusion preventing layer DB1 is made of an n type nitride semiconductor layer. Using such a diffusion preventing layer makes it possible, in manufacturing steps, to further suppress the diffusion of a p type impurity from the cap layer CP to the barrier layer BR and a decrease in the thickness of the barrier layer BR. The semiconductor device thus obtained has therefore more improved performance.

More preferably, the diffusion preventing layer DB1 has an aluminum composition ratio greater than the aluminum composition ratio of the barrier layer BR. Compared with the diffusion preventing layer having a small aluminum composition ratio, the diffusion preventing layer having a large aluminum composition ratio can suppress the diffusion of a p type impurity from the cap layer CP to the barrier layer BR and a decrease in the thickness of the barrier layer BR. The semiconductor device thus obtained has therefore further improved performance.

In the energy distribution of Example 1 in FIG. 16, a region having a depth x of from 0 to 32 nm corresponds to the cap layer CP, a region having a depth x of from 32 to 35 nm corresponds to the diffusion preventing layer DB1, a region having a depth x of from 35 to 49.5 nm corresponds to the barrier layer BR, and a region having a depth of about 49.5 nm or greater corresponds to the channel layer CH. This means that the thicknesses of the cap layer CP, the diffusion preventing layer DB1, and the barrier layer BR are set at 32 nm, 3 nm, and 14.5 nm, respectively. The thickness of the channel layer CH is set at 1 µm.

In this example, a p type nitride semiconductor layer made of gallium nitride (GaN) is used as the cap layer CP and the concentration of the p type impurity of the cap layer CP is set at $5 \times 10^{18}$ cm$^{-3}$. A nitride semiconductor layer made of aluminum gallium nitride is used as the diffusion preventing layer DB1. It has a composition of $Al_{0.20}Ga_{0.80}N$, meaning that the aluminum composition ratio is 0.20. The concentration of the n type impurity, that is, a donor in the diffusion preventing layer DB1 is set at $5 \times 10^{17}$ cm$^{-3}$. Further, a nitride semiconductor layer made of aluminum gallium nitride is used as the barrier layer BR and it has a composition of $Al_{0.15}Ga_{0.85}N$, meaning that the aluminum composition ratio is 0.15. The concentration of the n type impurity, that is, a donor of the barrier layer BR is set at $5 \times 10^{17}$ cm$^{-3}$. Further, a nitride semiconductor layer made of gallium nitride is used as the channel layer CH.

In Example 1, the cap layer CP and the barrier layer BR have therebetween the diffusion preventing layer DB1. It is therefore possible to suppress a decrease in the impurity concentration of the cap layer CP due to diffusion of magnesium (Mg), which is a p type impurity, from the cap layer CP and in energy distribution of Example 1 as shown in FIG. 16, increase the energy in the conduction band of the barrier layer BR. At the interface between the barrier layer BR and the channel layer CH, the energy in the conduction band of the channel layer CH can be prevented from becoming negative relative to the Fermi level. When no voltage is applied to the gate electrode GE, formation of the secondary electron gas 2DEG (refer to FIG. 15) can be suppressed at the interface between the barrier layer BR and the channel layer CH below the gate electrode GE. This means that formation of a channel for electrically coupling the source electrode SE and the drain electrode DE can be prevented and normally-off characteristics can be achieved surely. The semiconductor device thus obtained can therefore have improved performance.

Although not illustrated in FIG. 16, aside from Comparative Example 1, calculation was made assuming that the concentration of the p type impurity shows a stepwise decrease in the cap layer CP from the interface IF1 between the cap layer CP and the gate electrode GE to the interface IF2 between the cap layer CP and the diffusion preventing layer DB1. For example, it was assumed that in a portion, of the cap layer CP having a thickness of 32 nm and made of gallium nitride (GaN), having a thickness of 14 nm on the side of the interface IF1, that is, in a region having a depth x of from 0 to 14 nm, the concentration of the p type impurity, that is, an acceptor in the cap layer CP decreased to $2\times10^{18}$ cm$^{-3}$. It was assumed, on the other hand, that in a portion, of the cap layer CP having a thickness of 32 nm, having a thickness of 18 nm on the side of the interface IF2, that is, in a region having a depth x of from 14 to 32 nm, the concentration of the p type impurity, that is, an acceptor in the cap layer CP decreased to $5\times10^{17}$ cm$^{-3}$. Calculation of energy distribution was made under conditions similar to those of Comparative Example 1 except for the cap layer CP. The results thus calculated were compared with the results of Example 1.

Even when the calculation results are compared, the energy in the conduction band of the barrier layer BR showed an increase in Example 1. According to First Embodiment, even if it is compared with the case where the impurity diffuses to the barrier layer BR from a portion of the cap layer CP on the side of the barrier layer BR, a threshold voltage can be made positive and normally-off characteristics can be achieved surely. The semiconductor device thus obtained can therefore have improved performance.

In the semiconductor device of First Embodiment, the p type cap layer CP is not in direct contact with the n type barrier layer BR. Therefore, it is possible to suppress a change in the impurity distribution caused by diffusion of the impurity, which has been introduced in each of the barrier layer BR and the cap layer CP, by the heat treatment in the manufacturing steps and thereby suppress the resulting device from failing to obtain desired characteristics. Since the p type impurity of the cap layer CP does not diffuse, the piezo polarization generated at the interface between the channel layer CH made of, for example, gallium nitride (GaN) and the barrier layer BR made of, for example, an n type aluminum gallium nitride (AlGaN) can be offset with the piezo polarization generated at the interface between the cap layer CP and the diffusion preventing layer DB1 or the like. In addition, since the p type impurity concentration of the cap layer CP does not decrease, a negative space charge derived from the p type impurity does not decrease and therefore, energy in the conduction band of the cap layer CP does not decrease. It is therefore possible to prevent a decrease in the energy in the conduction band of the barrier layer BR which will otherwise be induced by the decrease in the energy of the conduction band of the cap layer CP. When no voltage is applied to the gate electrode GE, therefore, a current is prevented from flowing between the source electrode SE and the drain electrode DE and the device thus obtained can have desired normally-off characteristics.

Further, it is possible to suppress a decrease in the concentration of the n type impurity which has been introduced in the barrier layer BR, which decrease occurs because it is made up with the p type impurity diffused into the barrier layer BR from the p type cap layer CP. Or it is possible to suppress a decrease in the concentration of the n type impurity which has been introduced in the barrier BR, which decrease occurs because the n type impurity diffuses with the diffusion of the p type impurity. This makes it possible to prevent or suppress an increase in the on resistance caused by a decrease in the concentration of the carrier as a secondary electron gas, for example, between the gate electrode GE and the drain electrode DE or between the gate electrode GE and the source electrode SE. Further, it is possible to prevent or suppress a reduction in carrier mobility caused by the diffusion of an impurity in the channel layer CH below the gate electrode GE.

In First Embodiment, it is also possible to prevent a decrease in the thickness of the barrier layer BR which will otherwise occur by etching during etching of the semiconductor layer SL to form the cap layer CP. As described above referring to FIG. 17, the drain current Id in Example 2 becomes greater than the drain current Id in Comparative Example 1 in an ON state. This means that since the on-resistance in Example 1 can be made smaller than the on-resistance in Comparative Example 1 and a saturation current in Example 1 can be made greater than a saturation current in Comparative Example 1, the semiconductor device thus obtained can have improved performance.

Thus, according to First Embodiment, diffusion of the p type impurity in the cap layer CP due to heat treatment in the manufacturing steps can be suppressed and desired normally-off characteristics can therefore be achieved. In addition, in a step of etching the semiconductor layer SL to form the cap layer CP, a decrease in the thickness of the barrier layer BR is suppressed and therefore, an increase in the access resistance can be suppressed.

(Second Embodiment)

The semiconductor device of First Embodiment has the source electrode and the drain electrode on the diffusion preventing layer. In a semiconductor device of Second embodiment, on the other hand, a diffusion preventing layer is separated from each of a source electrode and a drain electrode and a barrier layer has, directly thereon, the source electrode and the drain electrode.

<Structure of Semiconductor Device and Operation of Semiconductor Device>

Figure 18:
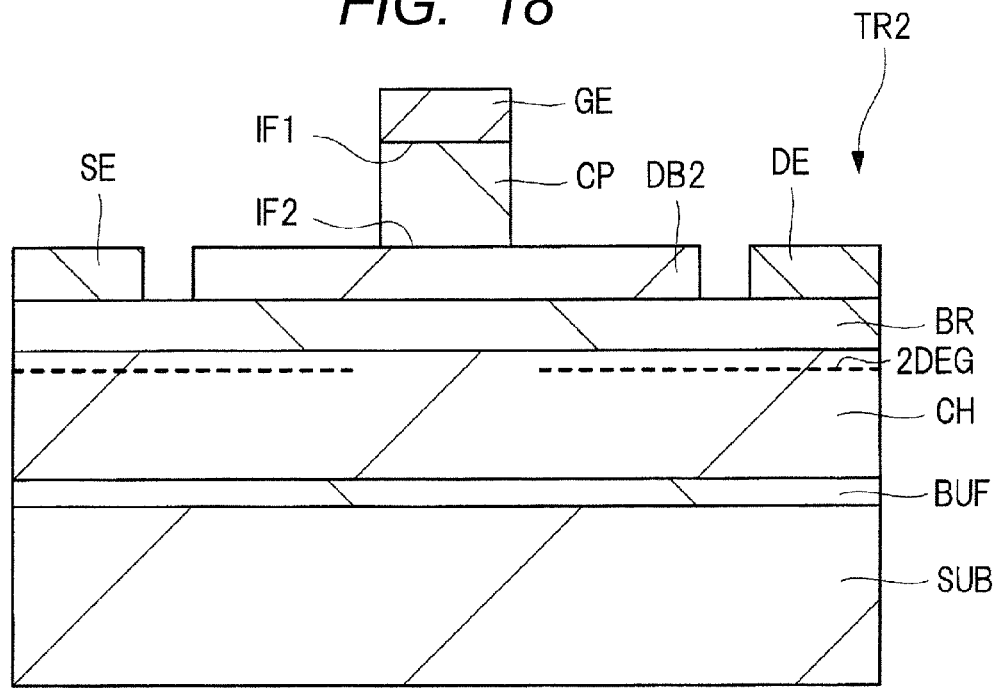
FIG. 18 is a fragmentary cross-sectional view of a semiconductor device according to Second Embodiment.

FIG. 18 is a fragmentary cross-sectional view of the semiconductor device of Second Embodiment.

As shown in FIG. 18, the semiconductor device of Second Embodiment is equipped with a transistor TR2, which is an HEMT, as a field effect transistor. The transistor TR2 has a substrate SUB, a buffer layer BUF formed on the substrate SUB, a channel layer CH formed on the buffer layer BUF and made of a nitride semiconductor layer, and a barrier layer BR formed on the channel layer CH and made of a nitride semiconductor layer.

In the transistor TR2 of Second Embodiment, the substrate SUB, the buffer layer BUF, the channel layer CH, and the barrier layer BR are the same as the substrate SUB, the buffer layer BUF, the channel layer CH, and the barrier layer BR in the transistor TR1 of First Embodiment, respectively, so that description on them will be omitted.

The transistor TR2 further has, on the barrier layer BR thereof, a source electrode SE and a drain electrode DE separated from each other and a diffusion preventing layer DB2 which is made of a nitride semiconductor layer and formed on the barrier layer BR sandwiched between the source electrode SE and the drain electrode DE while being separated from each of the source electrode SE and the drain electrode DE. The transistor TR2 further has a cap layer CP formed on the diffusion preventing layer DB2 and made of a nitride semiconductor layer and a gate electrode GE formed on the cap layer CP.

The cap layer CP and the gate electrode GE of the transistor TR2 of Second Embodiment are the same as the cap layer CP and the gate electrode GE of the transistor TR1 of the First Embodiment, respectively, so that description on them will be omitted. The materials of the diffusion preventing layer DB2, the source electrode SE, and the drain electrode DE of the transistor TR2 of Second Embodiment are the same as the materials of the diffusion preventing layer DB1, the source electrode SE, and the drain electrode DE of the transistor TR1 of First Embodiment, respectively.

In the transistor TR2 of Second Embodiment, similar to the transistor TR1 of First Embodiment, the barrier layer BR and the cap layer CP have therebetween the diffusion preventing layer DB2. The diffusion preventing layer DB2 is, similar to the diffusion preventing layer DB1 of First Embodiment, made of a nitride semiconductor layer containing aluminum (Al), preferably an n type nitride semiconductor layer. More preferably, similar to the diffusion preventing layer DB1 in First Embodiment, the aluminum composition ratio of the diffusion preventing layer DB2 is greater than the aluminum composition ratio of the barrier layer BR. This means that the barrier layer BR contains aluminum at a composition ratio smaller than the aluminum composition ratio of the diffusion preventing layer DB2 or contains no aluminum.

In the transistor TR2 of Second Embodiment, different from the transistor TR1 of First Embodiment, each of the source electrode SE and the drain electrode DE and the barrier layer BR do not have therebetween the diffusion preventing layer DB2.

In the transistor TR2 of Second Embodiment, the diffusion preventing layer DB2 is separated from each of the source electrode SE and the drain electrode DE. In other words, the diffusion preventing layer DB2 is in contact with neither the source electrode SE nor the drain electrode DE. Even if a large voltage has been applied between the source electrode SE and the drain electrode DE, when a voltage is not applied to the gate electrode GE, in other words, when the transistor TR2 is in an OFF state, a leakage current can be prevented from flowing between the source electrode SE and the drain electrode DE via the diffusion preventing layer DB2. The transistor TR2 has therefore an improved breakdown voltage.

Figure 19:
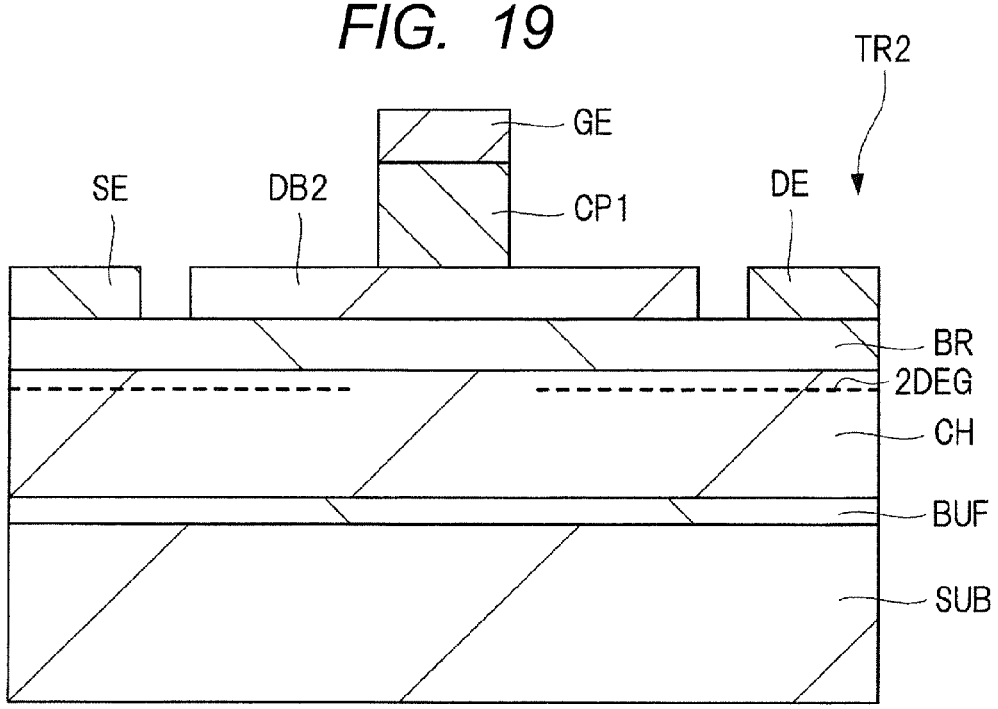
FIG. 19 is a fragmentary cross-sectional view of a semiconductor device according to a first modification example of Second Embodiment.
Figure 20:
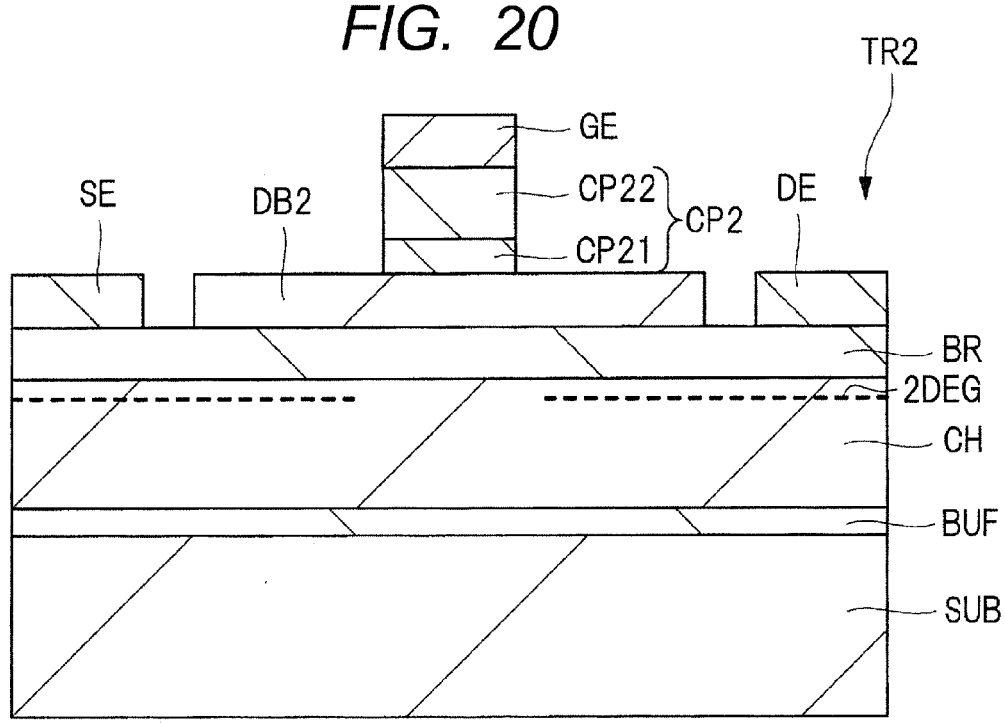
FIG. 20 is a fragmentary cross-sectional view of a semiconductor device according to a second modification example of Second Embodiment.
Figure 21:
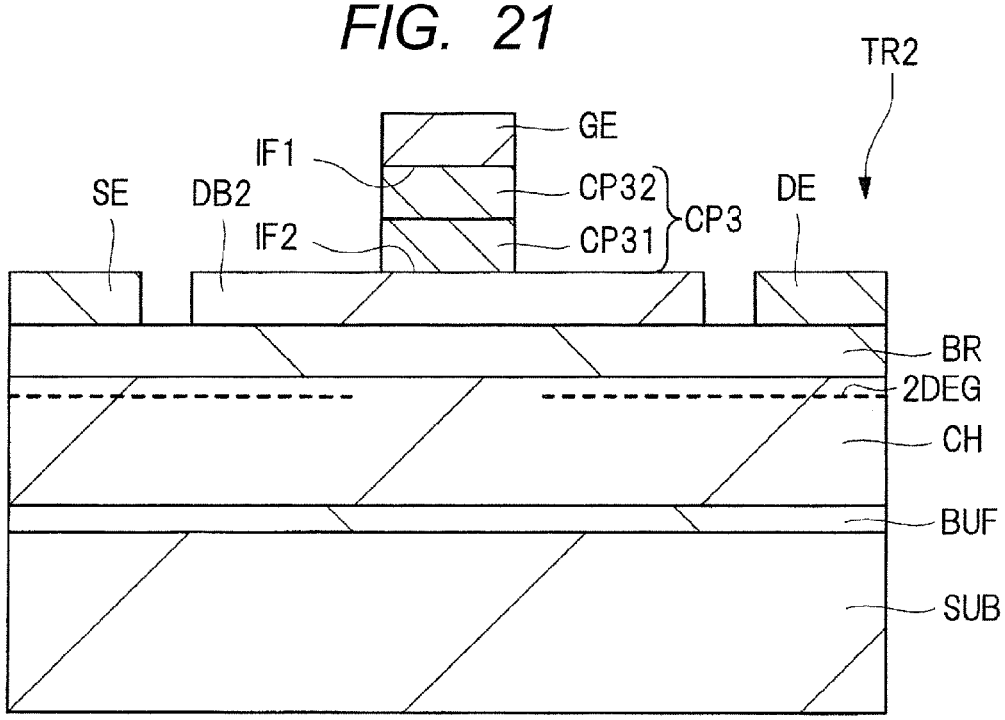
FIG. 21 is a fragmentary cross-sectional view of a semiconductor device according to a third modification example of Second Embodiment.

FIG. 19 is a fragmentary cross-sectional view of a semiconductor device according to a first modification example of Second Embodiment. FIG. 20 is a fragmentary cross-sectional view of a semiconductor device according to a second modification example of Second Embodiment. FIG. 21 is a fragmentary cross-sectional view of a semiconductor device according to a third modification example of Second Embodiment.

In the first modification example of Second Embodiment, similar to the first modification example of First Embodiment, the semiconductor device has a cap layer CP1 having carbon (C) introduced therein as a p type impurity as shown in FIG. 19 instead of the cap layer CP (refer to FIG. 18) having, for example, magnesium (Mg) introduced therein as a p type impurity. On the other hand, members of it are similar to the members of the semiconductor device of Second Embodiment except for the cap layer CP1.

In the second modification example of Second Embodiment, similar to the second modification example of First Embodiment, the semiconductor device has, instead of the cap layer CP (refer to FIG. 18), a cap layer CP2 as shown in FIG. 20. The cap layer CP2 has a cap layer CP21 and a cap layer CP22. The cap layer CP21 lies on the diffusion preventing layer DB2 sandwiched between the source electrode SE and the drain electrode DE. The cap layer CP22 is on the cap layer CP21. The cap layer CP22 has thereon a gate electrode GE. The cap layer CP21 and the cap layer CP22 are made similar to the cap layer CP21 and the cap layer CP22 in the second modification example of First Embodiment, respectively.

In the third modification example of Second Embodiment, similar to the third modification example of First Embodiment, the semiconductor device has, instead of the cap layer CP (refer to FIG. 18), a cap layer CP3 as shown in FIG. 21. Similar to the third modification example of First Embodiment, the concentration of magnesium (Mg) in the cap layer CP3 decreases from an interface IF1 between the cap layer CP3 and the gate electrode GE to an interface IF2 between the cap layer CP3 and the diffusion preventing layer DB2. The concentration of carbon (C) in the cap layer CP3 increases from the interface IF1 between the cap layer CP3 and the gate electrode GE to the interface IF2 between the cap layer CP3 and the diffusion preventing layer DB2. Similar to the third modification example of First Embodiment, it is preferred that the carbon concentration is greater than the magnesium concentration in a cap layer CP31, which is a lower layer portion of the cap layer CP3, and the carbon concentration is smaller than the magnesium concentration in a cap layer CP32, which is an upper layer portion of the cap layer CP3.

The first modification example of Second Embodiment to the third modification example of Second Embodiment have similar advantages to those of the first modification example of First Embodiment to the third modification example of First Embodiment, respectively, and diffusion of a p type impurity to the barrier layer BR can be prevented surely during heat treatment.

The operation of the transistor TR2 of Second Embodiment is also similar to the operation of the transistor TR1 of First Embodiment so that description on it will be omitted. As described above, in the transistor TR2 of Second Embodiment, however, a leakage current can be prevented from flowing between the source electrode SE and the drain electrode DE via the diffusion preventing layer DB2 in an OFF state. This enables the transistor TR2 to have an improved breakdown voltage.

<Method of Manufacturing Semiconductor Device>

Figure 22:
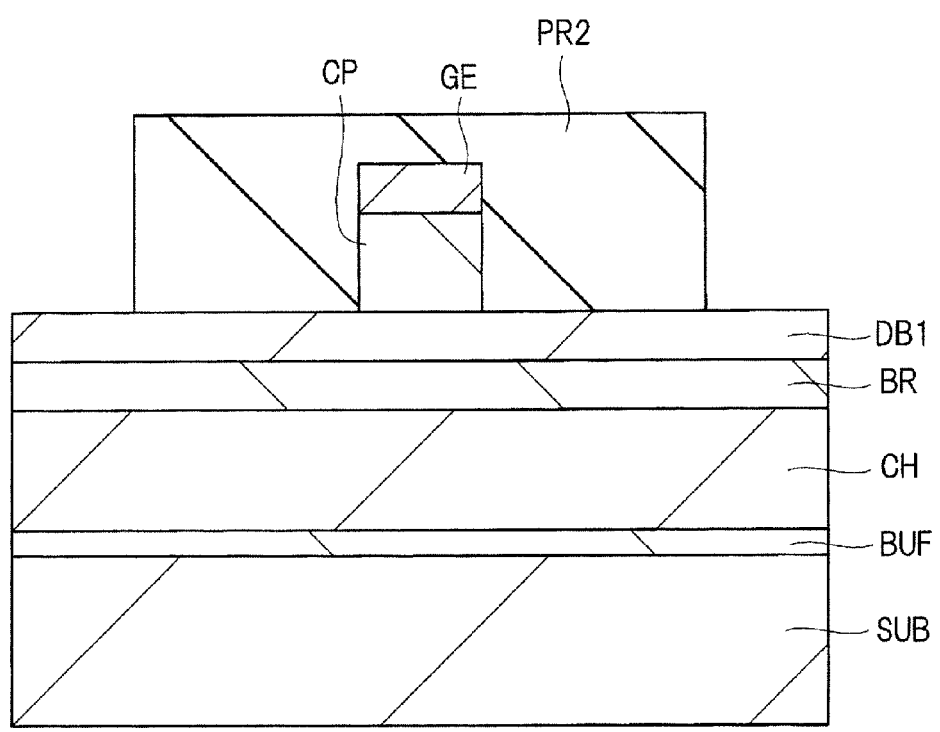
FIG. 22 is a fragmentary cross-sectional view of the semiconductor device according to Second Embodiment during a manufacturing step thereof.
Figure 23:
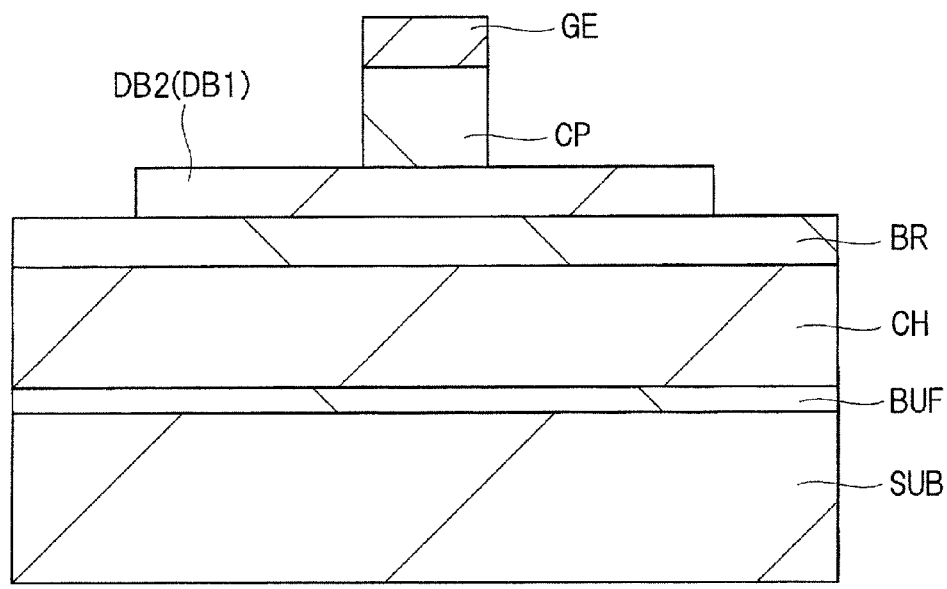
FIG. 23 is a fragmentary cross-sectional view of the semiconductor device according to Second Embodiment during another manufacturing step thereof.

Next, a method of manufacturing the semiconductor device of Second Embodiment will be described. FIGS. 22 and 23 are fragmentary cross-sectional views of the semiconductor device of Second Embodiment during manufacturing steps thereof.

In the method of manufacturing the semiconductor device of Second Embodiment, after formation of the cap layer CP by conducting, for example, steps similar to those described referring to FIG. 6 and FIGS. 10 to 12 in First Embodiment, the diffusion preventing layer DB1 is patterned. The step described referring to FIG. 6 may be replaced with the steps described referring to FIGS. 7 to 9.

Described specifically, a resist film PR2 (refer to FIG. 22) is applied onto the diffusion preventing layer DB1 including the upper surface of the gate electrode GE. The resulting resist film PR2 is then subjected to exposure and development treatment to pattern the resist film PR2 as shown in FIG. 22. The patterning of the resist film PR2 is conducted so as to expose a region from which the diffusion preventing layer DB1 is removed. This region includes a region where the source electrode SE (refer to FIG. 18) is to be formed and a region where the drain electrode DE (refer to FIG. 18) is to be formed.

With the patterned resist film PR2 as a mask, the diffusion preventing layer DB1 is removed by etching to form a diffusion preventing layer DB2 made of the patterned diffusion preventing layer DB1 as shown in FIG. 23. More specifically, etching of the diffusion preventing layer DB1 can be achieved, for example, by dry etching with an etching gas obtained by adding an oxygen ($O_2$) gas or a sulfur hexafluoride ($SF_6$) gas to a chlorine ($Cl_2$) gas. Then, the resist film PR2 is removed.

At this time, the diffusion preventing layer DB2 is separated from each of the region where the source electrode SE (refer to FIG. 18) is to be formed and the region where the drain electrode DE (refer to FIG. 18) is to be formed.

Next, the source electrode SE (refer to FIG. 18) and the drain electrode DE (refer to FIG. 18) are formed on the barrier layer BR, for example, by using a lift-off process. As steps for forming the source electrode SE and the drain electrode DE by using this lift-off process, steps similar to those described using FIGS. 13 and 14 in First Embodiment can be conducted. In such a manner, the transistor TR2 of Second Embodiment can be manufactured as shown in FIG. 18.

<Chief Characteristics and Advantages of Present Embodiment>

The semiconductor device of Second Embodiment has, similar to the semiconductor device of First Embodiment, the diffusion preventing layer DB2 between the barrier layer BR and the cap layer CP. The diffusion preventing layer DB2 is made of a nitride semiconductor layer containing aluminum (Al), preferably an n type nitride semiconductor layer. More preferably, the diffusion preventing layer DB2 has an aluminum composition ratio greater than the aluminum composition ratio of the barrier layer BR. As in First Embodiment, this makes it possible to suppress diffusion of the p type impurity from the cap layer CP to the barrier layer BR and a decrease in the thickness of the barrier layer BR in the manufacturing steps. As a result, the semiconductor device thus obtained can have improved performance.

In the semiconductor device of Second Embodiment, on the other hand, the diffusion preventing layer DB2 is separated from each of the source electrode SE and the drain electrode DE. This makes it possible to prevent a leakage current from flowing between the source electrode SE and the drain electrode DE when a voltage is not applied to the gate electrode GE, even when a large voltage is applied between the source electrode SE and the drain electrode DE. Therefore the semiconductor device thus obtained has an improved breakdown voltage.

(Third Embodiment)

The semiconductor device of First Embodiment has a semiconductor layer neither between the cap layer and the source electrode nor between the cap layer and the drain electrode. The semiconductor device of Third Embodiment, on the other hand, has a semiconductor layer between the cap layer and the source electrode and between the cap layer and the drain electrode.

<Structure of Semiconductor Device and Operation of Semiconductor Device>

Figure 24:
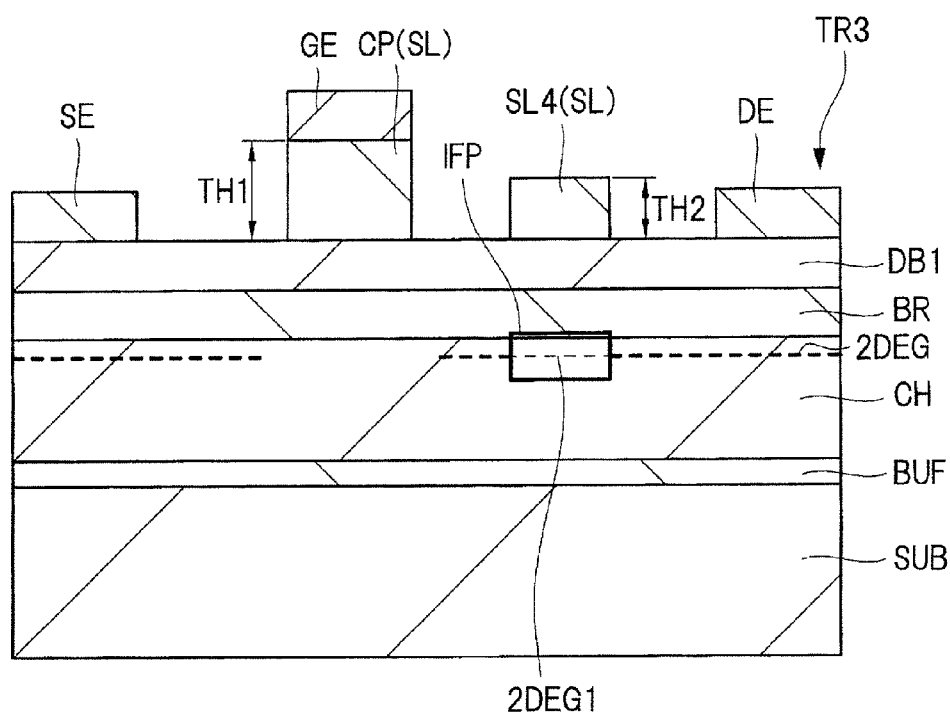
FIG. 24 is a fragmentary cross-sectional view of a semiconductor device according to Third Embodiment.

FIG. 24 is a fragmentary cross-sectional view of the semiconductor device of Third Embodiment.

As shown in FIG. 24, the semiconductor device of Third Embodiment has a transistor TR3, which is an HEMT, as a field effect transistor. The transistor TR3 has a substrate SUB, a buffer layer BUF formed on the substrate SUB, a channel layer CH formed on the buffer layer BUF and made of a nitride semiconductor layer, and a barrier layer BR formed on the channel layer CH and made of a nitride semiconductor layer. The transistor TR3 further has a diffusion preventing layer DB1 formed on the barrier layer BR and made of a nitride semiconductor layer.

The substrate SUB, the buffer layer BUF, the channel layer CH, the barrier layer BR, and the diffusion preventing layer DB of the transistor TR3 of Third Embodiment are the same as the substrate SUB, the buffer layer BUF, the channel layer CH, the barrier layer BR, and the diffusion preventing layer DB of the transistor TR1 of First Embodiment, respectively, so that description on them will be omitted.

The transistor TR3 further has, on the diffusion preventing layer DB1, a source electrode SE and a drain electrode DE separated from each other. The transistor TR3 still further has a cap layer CP made of a nitride semiconductor layer and formed on the diffusion preventing layer DB1 sandwiched between the source electrode SE and the drain electrode DE while being separated from each of the source electrode SE and the drain electrode DE. The transistor TR3 still further has a gate electrode GE formed on the cap layer CP.

The source electrode SE, the drain electrode DE, the cap layer CP, and the gate electrode GE of the transistor TR3 of Third Embodiment are the same as the source electrode SE, the drain electrode DE, the cap layer CP, and the gate electrode GE of the transistor TR1 of First Embodiment, respectively, so that description on them will be omitted.

The transistor TR3 of Third Embodiment also has, similar to the transistor TR1 of First Embodiment, the diffusion preventing layer DB1 between the barrier layer BR and the cap layer CP. The diffusion preventing layer DB1 is also present between each of the source electrode SE and the drain electrode DE and the barrier layer BR.

The transistor TR3 of Third Embodiment has, on the other hand, a semiconductor layer SL4. The semiconductor layer SL4 lies on the diffusion preventing layer DB1 sandwiched between the cap layer CP and the source electrode SE or on the diffusion preventing layer DB1 sandwiched between the cap layer CP and the drain electrode DE. The semiconductor layer SL4 is preferably separated from each of the cap layer CP, the source electrode SE, and the drain electrode DE. The semiconductor layer SL4 may however be contiguous to any of the cap layer CP, the source electrode SE, and the drain electrode DE.

The semiconductor layer SL4 is a p type nitride semiconductor layer and it is preferably made of gallium nitride (GaN). The semiconductor layer SL4 is a semiconductor layer showing p type conductivity. It is, in other words, a p type semiconductor layer. The semiconductor layer SL4 has, for example, magnesium (Mg) introduced therein as a p type impurity.

The semiconductor layer SL4 is preferably made of a p type semiconductor layer SL which is the same layer as the semiconductor layer SL configuring the cap layer CP. This makes it possible to reduce the number of steps because the step of forming the cap layer CP made of the semiconductor layer SL and the step of forming the semiconductor layer SL4 made of the semiconductor layer SL can be conducted as a single step.

When the barrier layer BR has thereon the semiconductor layer SL4, piezo polarization generated at the interface between the channel layer CH and the barrier layer BR can be offset to some extent with piezo polarization generated at the interface between the semiconductor layer SL4 and the diffusion preventing layer DB1 or the like so that energy in the conduction band of the barrier layer BR shows a certain level of increase below the semiconductor layer SL4. In addition, the energy in the conduction band of the semiconductor layer SL4 increases due to a negative space charge derived from the p type impurity in the semiconductor layer SL4, which induces an increase in the energy in the conduction band of the barrier layer BR. As a result, when no voltage is applied to the gate electrode GE, a secondary electron gas 2DEG1 formed below the semiconductor layer SL4 and in a portion IFP in the channel layer CH in the vicinity of the interface with the barrier layer BR can be made less than a secondary electron gas 2DEG formed in the channel layer CH in a region other than the regions where the cap layer CP and the semiconductor layer SL4 have been formed.

FIG. 24 shows, with a broken line thinner than a broken line showing the secondary electron gas 2DEG formed in the channel layer CH in a region other than regions where the cap layer CP and the semiconductor layer SL4 have been formed, the secondary electron gas 2DEG1 formed below the semiconductor layer SL4 and in the portion IFP in the channel layer CH in the vicinity of the interface with the barrier layer BR. This indicates that the secondary electron gas 2DEG1 formed below the semiconductor layer SL4 and in the portion IFP in the channel layer CH in the vicinity of the interface with the barrier layer BR is less than the secondary electron gas 2DEG formed in the channel layer CH in a region other than regions where the cap layer CP and the semiconductor layer SL4 have been formed.

When such a semiconductor layer SL4 is formed on the diffusion preventing layer DB1 sandwiched between the cap layer CP and the drain electrode DE, a leakage current can be suppressed from flowing between the source electrode SE and the drain electrode DE via the secondary electron gas 2DEG. When the semiconductor layer SL4 is formed on the diffusion preventing layer DB1 sandwiched between the cap layer CP and the source electrode SE, a leakage current can be suppressed from flowing between the source electrode SE and the drain electrode DE via the secondary electron gas 2DEG. As a result, the transistor TR3 can have an improved gate-drain breakdown voltage.

When the semiconductor layer SL4 is made of a p type semiconductor layer SL which is the same layer as the semiconductor layer SL configuring the cap layer CP, supposing that the thickness of the cap layer is TH1 and the thickness of the semiconductor layer SL4 is TH2, the thickness TH2 of the semiconductor layer SL4 is preferably smaller than the thickness TH1 of the cap layer CP.

When the thickness TH2 of the semiconductor layer SL4 is equal to the thickness TH1 of the cap layer CP or greater than the thickness TH1 of the cap layer CP, there is a possibility of the secondary electron gas 2DEG1 decreasing in the channel layer CH below the semiconductor layer SL4 even when the transistor TR3 is in an ON state. In such a case, there is a possibility of an increase in the resistance between the source electrode SE and the drain electrode DE when the transistor TR3 is in an ON state, that is, on-resistance.

On the other hand, when the thickness TH2 of the semiconductor layer SL4 is smaller than the thickness TH1 of the cap layer CP, the secondary electron gas 2DEG1 to be formed in the channel layer CH below the semiconductor layer SL4 can be adjusted so as not to decrease when the transistor TR3 is in an ON state. This makes it possible to suppress an increase in the resistance between the source electrode SE and the drain electrode DE when the transistor TR3 is in an ON state, that is, on-resistance.

More preferably, the thickness TH2 of the semiconductor layer SL4 can be made smaller than the thickness TH1 of the cap layer CP to such an extent as not to cause disappearance of the secondary electron gas 2DEG1 in the channel layer CH below the semiconductor layer SL4 even when a voltage is not applied to the gate electrode GE. This means that more preferably, the thickness TH2 of the semiconductor layer SL4 can be made smaller than the thickness causing disappearance of the secondary electron gas 2DEG1 in the channel layer CH below the semiconductor layer SL4 when no voltage is applied to the gate electrode GE.

When the transistor TR3 is a high frequency transistor, the semiconductor layer SL4 is formed preferably between the cap layer CP and the drain electrode DE as shown in FIG. 24. Compared with the semiconductor layer SL4 formed between the cap layer CP and the source electrode SE, the above-mentioned semiconductor layer can improve the amplification ratio, that is, the gain of the transistor TR3.

The operation of the transistor TR3 of Third Embodiment is similar to that of the transistor TR1 of First Embodiment so that description on it will be omitted. As described above, however, in the transistor TR3 of Third Embodiment, a leakage current can be suppressed from flowing between the source electrode SE and the drain electrode DE via the secondary electron gas 2DEG in an OFF state. As a result, the transistor TR3 thus obtained has an improved breakdown voltage.

<Method of Manufacturing Semiconductor Device>

Figure 25:
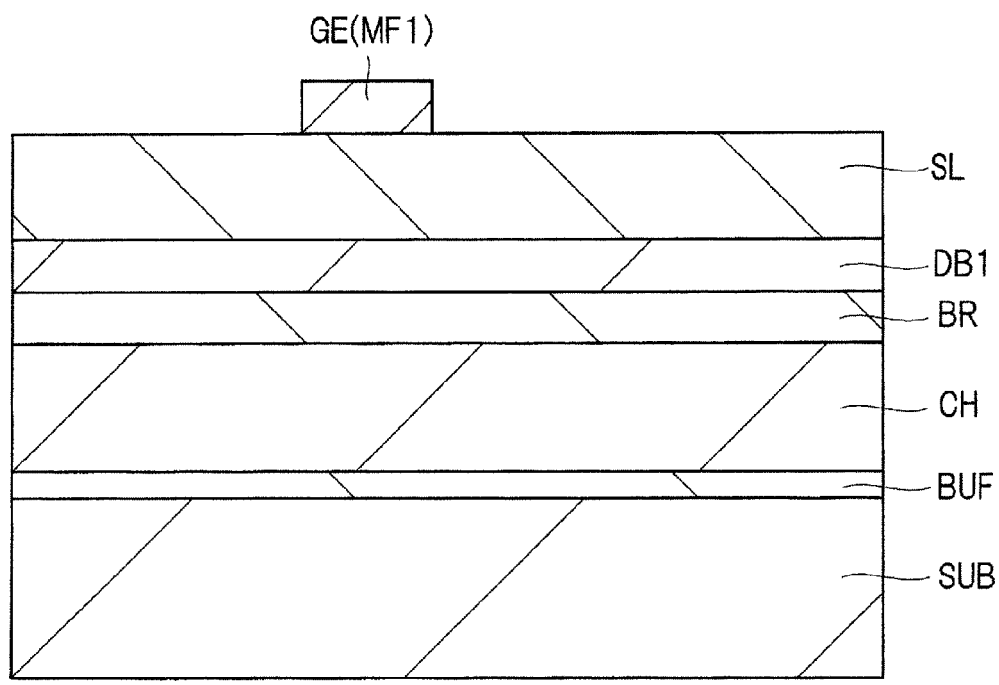
FIG. 25 is a fragmentary cross-sectional view of the semiconductor device according to Third Embodiment during a manufacturing step thereof.
Figure 26:
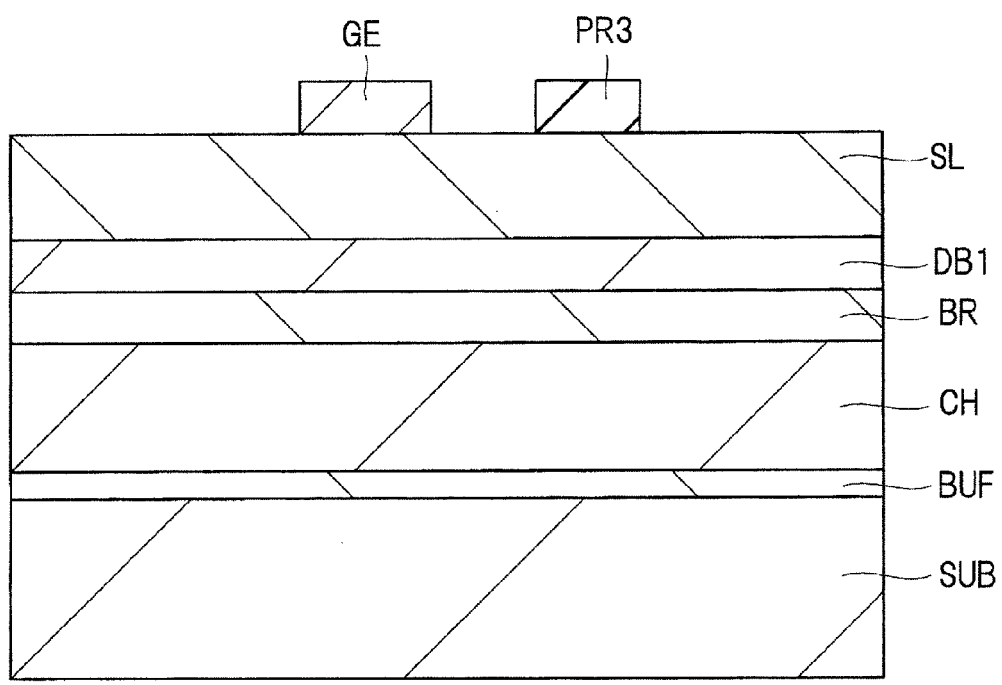
FIG. 26 is a fragmentary cross-sectional view of the semiconductor device according to Third Embodiment during another manufacturing step thereof.
Figure 27:
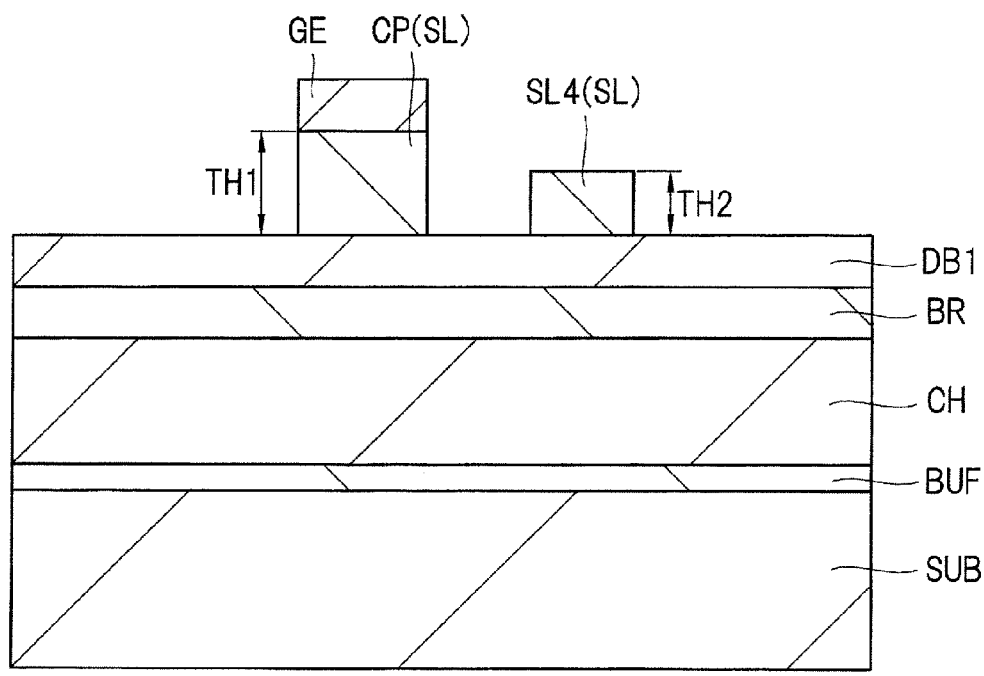
FIG. 27 is a fragmentary cross-sectional view of the semiconductor device according to Third Embodiment during another manufacturing step thereof.

Next, a method of manufacturing the semiconductor device of Third Embodiment will be described. FIGS. 25 to 27 are fragmentary cross-sectional views of the semiconductor device of Third Embodiment during manufacturing steps thereof.

In the method of manufacturing the semiconductor device of Third Embodiment, after formation of a gate electrode GE made of a metal film MF1 as shown in FIG. 25, for example, by conducting steps similar to those described referring to FIG. 6 and FIGS. 10 and 11 in First Embodiment, the semiconductor layer SL is patterned.

More specifically, a resist film PR3 (refer to FIG. 26) is applied onto the semiconductor layer SL including the upper surface of the gate electrode GE. The resist film PR3 is then subjected to exposure and development treatment to pattern the resist film PR3 as shown in FIG. 26. Patterning of the resist film PR3 is conducted so as to expose a region other than a region where the semiconductor layer SL4 (refer to FIG. 24) is to be formed, while not exposing the region where the semiconductor layer SL4 is to be formed. The region where the semiconductor layer SL4 is to be formed is located between a region where the source electrode SE (refer to FIG. 24) is to be formed and a region where the cap layer CP (refer to FIG. 24) is to be formed or a region where the drain electrode DE (refer to FIG. 24) is to be formed and the region where the cap layer CP (refer to FIG. 24) is to be formed.

Next, with the gate electrode GE and the patterned resist film PR3 as a mask, the semiconductor layer SL is removed by etching, by which as shown in FIG. 27, a cap layer CP made of the semiconductor layer SL is formed below the gate electrode GE and the semiconductor layer SL4 made of the semiconductor layer SL is formed below the resist film PR3 (refer to FIG. 26). More specifically, etching of the semiconductor layer SL can be conducted, for example, by dry etching with an etching gas obtained by adding an oxygen ($O_2$) gas or a sulfur hexafluoride ($SF_6$) gas to a chlorine ($Cl_2$) gas.

At this time, by adjusting a ratio of the etching rate of the resist film PR3 to the etching rate of the semiconductor layer SL, that is, an etching selectivity and the thickness of the resist film PR3, the resist film PR3 is removed to expose the semiconductor layer SL from the resist film PR3 halfway through etching of the semiconductor layer SL. Such a method makes it possible to make the thickness TH2 of the semiconductor layer SL4 smaller than the thickness TH1 of the cap layer CP.

As a result, the cap layer CP is formed below the gate electrode GE and at the same time, on the diffusion preventing layer DB1. The semiconductor layer SL4 is formed on the diffusion preventing layer DB1 and at the same time, in a region between the region where the cap layer CP has been formed and the region where the source electrode SE (refer to FIG. 24) is to be formed or a region between the region where the cap layer CP has been formed and the region where the drain electrode DE (refer to FIG. 24) is to be formed.

Next, the source electrode SE (refer to FIG. 24) and the drain electrode DE (refer to FIG. 24) are formed on the diffusion preventing layer DB1, for example, by a lift-off process. As a step of forming the source electrode SE and the drain electrode DE by using this lift-off process, steps similar to those described referring to FIGS. 13 and 14 in First Embodiment can be conducted. As described above, the transistor TR3 of Third Embodiment can be manufactured as shown in FIG. 24.

<Chief Characteristics and Advantages of Present Embodiment>

In the semiconductor device of Third Embodiment, similar to the semiconductor device of First Embodiment, the barrier layer BR and the cap layer CP have therebetween the diffusion preventing layer DB1. The diffusion preventing layer DB1 is made of a nitride semiconductor layer containing aluminum (Al), preferably an n type nitride semiconductor layer. More preferably, the diffusion preventing layer DB1 has an aluminum composition ratio greater than the aluminum composition ratio of the barrier layer BR. As in First Embodiment, the present embodiment can suppress diffusion of a p type impurity from the cap layer CP to the barrier layer BR and a decrease in the thickness of the barrier layer BR in the manufacturing steps. The semiconductor device thus obtained can therefore have improved performance.

The semiconductor device of Third Embodiment is different from the semiconductor device of First Embodiment in that it has the semiconductor layer SL4 on the diffusion preventing layer DB1 sandwiched between the cap layer CP and the source electrode SE or on the diffusion preventing layer DB1 sandwiched between the cap layer CP and the drain electrode DE. A leakage current can therefore be suppressed from flowing between the source electrode SE and the drain electrode DE via the secondary electron gas. The semiconductor device thus obtained can have an improved breakdown voltage.

(Fourth Embodiment)

The semiconductor device of Third Embodiment has the source electrode and the drain electrode on the diffusion preventing layer. The semiconductor device of Fourth Embodiment, on the other hand, has a diffusion preventing layer separated from each of a source electrode and a drain electrode. The source electrode and the drain electrode lie directly on a barrier layer. This means that the relationship between the semiconductor device of Third Embodiment and the semiconductor device of Fourth Embodiment is similar to that between the semiconductor device of First Embodiment and the semiconductor device of Second Embodiment.

<Structure of Semiconductor Device and Operation of Semiconductor Device>

Figure 28:
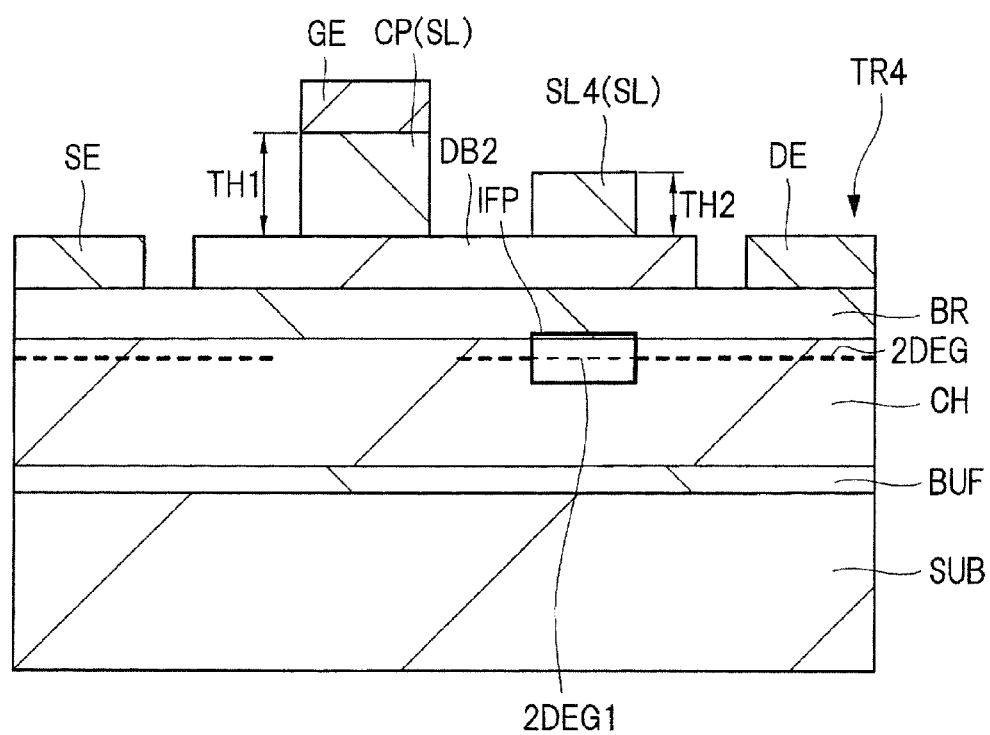
FIG. 28 is a fragmentary cross-sectional view of a semiconductor device according to Fourth Embodiment.

FIG. 28 is a fragmentary cross-sectional view of the semiconductor device of Fourth Embodiment.

As shown in FIG. 28, the semiconductor device of Fourth Embodiment has a transistor TR4, which is an HEMT, as a field effect transistor. The transistor TR4 has a substrate SUB, a buffer layer BUF formed on the substrate SUB, a channel layer CH formed on the buffer layer BUF and made of a nitride semiconductor layer, and a barrier layer BR formed on the channel layer CH and made of a nitride semiconductor layer.

In the transistor TR4 of Fourth Embodiment, the substrate SUB, the buffer layer BUF, the channel layer CH, and the barrier layer BR are the same as the substrate SUB, the buffer layer BUF, the channel layer CH, and the barrier layer BR in the transistor TR3 of Third Embodiment, respectively so that description on them will be omitted.

The transistor TR4 further has, on the barrier layer BR thereof, a source electrode SE and a drain electrode DE separated from each other and, on the barrier layer BR sandwiched between the source electrode SE and the drain electrode DE, a diffusion preventing layer DB2 separated from each of the source electrode SE and the drain electrode DE. The transistor TR4 further has a cap layer CP formed on the diffusion preventing layer DB2 and made of a nitride semiconductor layer and a gate electrode GE formed on the cap layer CP.

The cap layer CP and the gate electrode GE of the transistor TR4 of Fourth Embodiment are the same as the cap layer CP and the gate electrode GE of the transistor TR3 of Third Embodiment so that description on them will be omitted. The materials of the diffusion preventing layer DB2, the source electrode SE, and the drain electrode DE of the transistor TR4 of Fourth Embodiment are the same as the materials of the diffusion preventing layer DB2, the source electrode SE, and the drain electrode DE of the transistor TR2 of Second Embodiment, respectively so that description on them will be omitted.

The transistor TR4 of Fourth Embodiment has, similar to the transistor TR3 of Third Embodiment, a semiconductor layer SL4. The semiconductor layer SL4 is on the diffusion preventing layer DB2 sandwiched between the cap layer CP and the source electrode SE or on the diffusion preventing layer DB2 sandwiched between the cap layer CP and the drain electrode DE. The semiconductor layer SL4 is preferably separated from each of the cap layer CP, the source electrode SE, and the drain electrode DE. The semiconductor layer SL4 may, however, be contiguous to the cap layer CP.

The material of the semiconductor layer SL4 is the same as that of the semiconductor layer SL4 of the transistor TR3 of Third Embodiment so that description on it will be omitted. The semiconductor layer SL4 is, similar to that of Third Embodiment, made of preferably a p type semiconductor layer SL which is the same layer as the semiconductor layer SL configuring the cap layer CP so that the number of steps can be reduced as in Third Embodiment.

In Fourth Embodiment, the transistor TR4 can have an improved breakdown voltage as in Third Embodiment even when it has the semiconductor layer SL4 on the diffusion preventing layer DB2 sandwiched between the cap layer CP and the drain electrode DE or on the diffusion preventing layer DB2 sandwiched between the cap layer CP and the source electrode SE.

In this embodiment, similar to Third Embodiment, when the semiconductor layer SL4 is made of a p type semiconductor layer SL which is the same layer as the semiconductor layer SL configuring the cap layer CP, the thickness TH2 of the semiconductor layer SL4 is preferably smaller than the thickness TH1 of the cap layer CP. As in Third Embodiment, this makes it possible to suppress an increase in the resistance between the source electrode SE and the drain electrode DE when the transistor TR4 is in an ON state, that is, on-resistance.

Similar to FIG. 24, FIG. 28 shows, with a broken line thinner than a broken line showing a secondary electron gas 2DEG formed in the channel layer CH in a region other than regions where the cap layer CP and the semiconductor layer SL4 have been formed, a secondary electron gas 2DEG1 formed in a portion IFP located below the semiconductor layer SL4 and in the channel layer CH in the vicinity of the interface with the barrier layer BR.

When the transistor TR4 is a high frequency transistor, it has, as in Third Embodiment, the semiconductor layer SL4 preferably between the cap layer CP and the drain electrode DE as shown in FIG. 28. Such a semiconductor layer can improve the amplification ratio, that is, the gain of the transistor TR4.

In the transistor TR4 of Fourth Embodiment, similar to the transistor TR2 of Second Embodiment, the diffusion preventing layer DB2 is separated from each of the source electrode SE and the drain electrode DE. As in Second Embodiment, therefore, even when a large voltage is applied between the source electrode SE and the drain electrode DE, a leakage current is prevented from flowing between the source electrode SE and the drain electrode DE when a voltage to be applied to the gate electrode GE is set at zero. The transistor TR4 can therefore have an improved breakdown voltage.

The operation of the transistor TR4 of Fourth Embodiment is similar to that of the transistor TR1 of First Embodiment so that description on it will be omitted. The transistor TR4 of Fourth Embodiment, however, can prevent or suppress a leakage current from flowing between the source electrode SE and the drain electrode DE via the secondary electron gas 2DEG or the diffusion preventing layer DB2 in an OFF state. As a result, the transistor TR4 can have an improved breakdown voltage.

<Method of Manufacturing Semiconductor Device>

Figure 29:
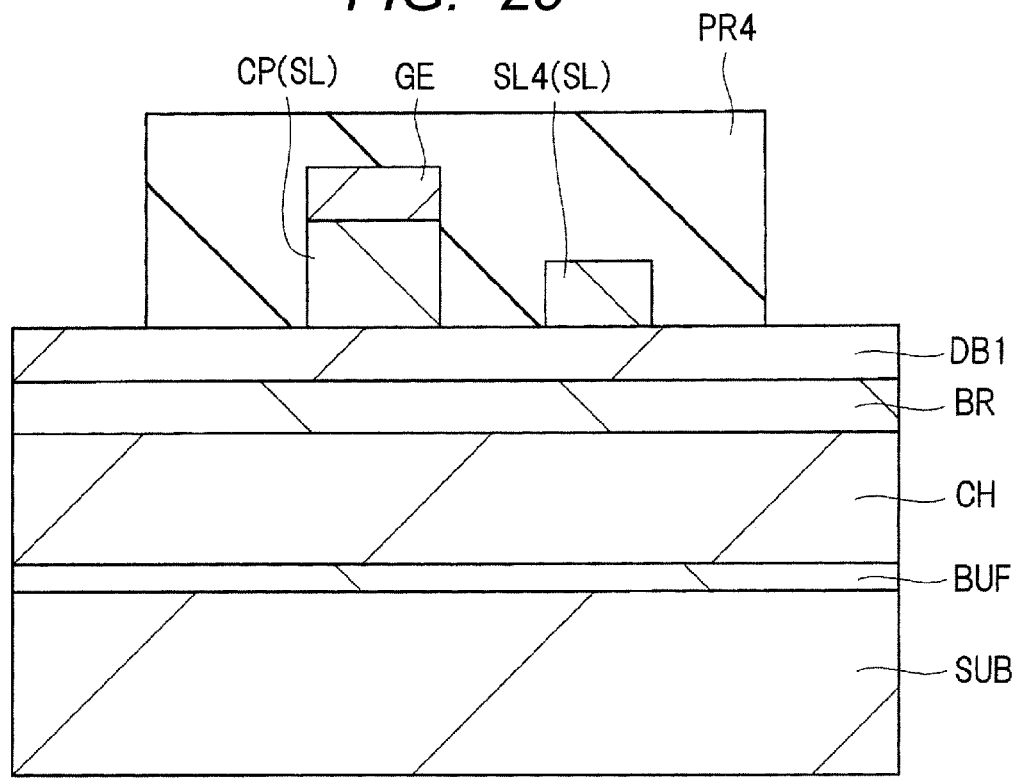
FIG. 29 is a fragmentary cross-sectional view of the semiconductor device according to Fourth Embodiment during a manufacturing step thereof.
Figure 30:
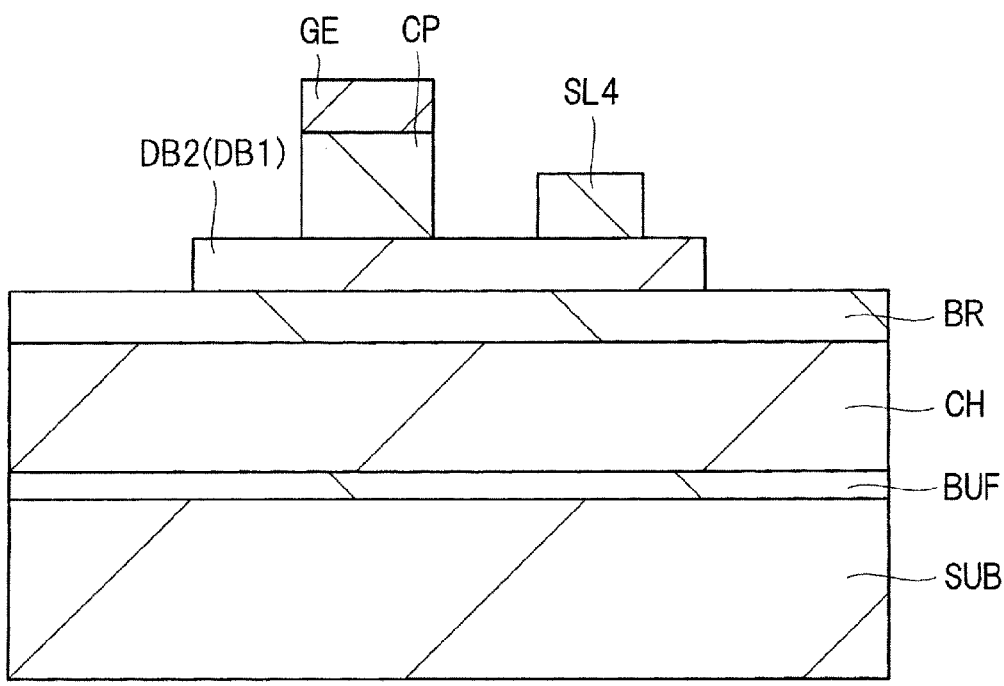
FIG. 30 is a fragmentary cross-sectional view of the semiconductor device according to Fourth Embodiment during another manufacturing step thereof.

Next, a method of manufacturing the semiconductor device of Fourth Embodiment will be described. FIGS. 29 and 30 are fragmentary cross-sectional views of the semiconductor device of Fourth Embodiment during manufacturing steps thereof.

In the method of manufacturing the semiconductor device of Fourth Embodiment, a gate electrode GE is formed as described referring to FIG. 25 in Third Embodiment, for example, by conducting steps similar to those described referring to FIG. 6 and FIGS. 10 and 11 in First Embodiment. Next, a semiconductor layer SL is patterned by conducting steps similar to those described referring to FIGS. 26 and 27 in Third Embodiment to form a cap layer CP and a semiconductor layer SL4. Then, a diffusion preventing layer DB1 is patterned.

Described specifically, a resist film PR4 (refer to FIG. 29) is applied onto the diffusion preventing layer DB1 including the upper surfaces of the gate electrode GE and the semiconductor layer SL4. The resulting resist film PR4 is subjected to exposure and development treatment to pattern the resist film PR4 as shown in FIG. 29. The patterning of the resist film PR4 is conducted so as to expose a region from which the diffusion preventing layer DB1 is removed. This region includes a region where the source electrode SE (refer to FIG. 28) is to be formed and a region where the drain electrode DE (refer to FIG. 28) is to be formed.

With the patterned resist film PR4 as a mask, the diffusion preventing layer DB1 is removed by etching to form a diffusion preventing layer DB2 made of the patterned diffusion preventing layer DB1 as shown in FIG. 30. More specifically, etching of the diffusion preventing layer DB1 can be conducted, for example, by dry etching with an etching gas obtained by adding an oxygen ($O_2$) gas or a sulfur hexafluoride ($SF_6$) gas to a chlorine ($Cl_2$) gas. Then, the resist film PR4 is removed.

At this time, the diffusion preventing layer DB2 is separated from each of the region where the source electrode SE (refer to FIG. 28) is to be formed and the region where the drain electrode DE (refer to FIG. 28) is to be formed.

Next, the source electrode SE (refer to FIG. 28) and the drain electrode DE (refer to FIG. 28) are formed on the barrier layer BR, for example, by a lift-off process. As steps for forming the source electrode SE and the drain electrode DE by this lift-off process, steps similar to those described using FIGS. 13 and 14 in First Embodiment can be conducted. In such a manner, the transistor TR4 of Fourth Embodiment can be manufactured as shown in FIG. 28.

<Chief Characteristics and Advantages of Present Embodiment>

The semiconductor device of Fourth Embodiment has, similar to the semiconductor device of First Embodiment, the diffusion preventing layer DB2 between the barrier layer BR and the cap layer CP. The diffusion preventing layer DB2 is made of a nitride semiconductor layer containing aluminum (Al), preferably an n type nitride semiconductor layer. More preferably, the diffusion preventing layer DB2 has an aluminum composition ratio greater than the aluminum composition ratio of the barrier layer BR. As in First Embodiment, this makes it possible to suppress diffusion of the p type impurity from the cap layer CP to the barrier layer BR and a decrease in the thickness of the barrier layer BR in the manufacturing steps. The semiconductor device thus obtained can therefore have improved performance.

In the semiconductor device of Fourth Embodiment similar to the semiconductor device of Second Embodiment, the diffusion preventing layer DB2 is separated from each of the source electrode SE and the drain electrode DE. Even when a large voltage is applied between the source electrode SE and the drain electrode DE, therefore, a leakage current can be prevented from flowing between the source electrode SE and the drain electrode DE when a voltage is not applied to the gate electrode GE. The semiconductor device thus obtained can therefore have an improved breakdown voltage.

Moreover, the semiconductor device of Fourth Embodiment has, similar to the semiconductor device of Third Embodiment, the semiconductor layer SL4 on the diffusion preventing layer DB2 sandwiched between the cap layer CP and the source electrode SE or on the diffusion preventing layer DB2 sandwiched between the cap layer CP and the drain electrode DE. This makes it possible to suppress a leakage current from flowing between the source electrode SE and the drain electrode DE via a secondary electron gas. The semiconductor device thus obtained can therefore have an improved breakdown voltage.

The invention made by the present inventors has been described specifically based on some embodiments. It is needless to say that the invention is not limited to these embodiments but can be changed in various ways without departing from the gist of the invention.

What is claimed is:

1. A semiconductor device, comprising:
   a substrate;
   a first nitride semiconductor layer formed over the substrate;
   a second nitride semiconductor layer formed over the first nitride semiconductor layer;
   a third nitride semiconductor layer formed over the second nitride semiconductor layer;
   a source electrode and a drain electrode for a field effect transistor formed on the third nitride semiconductor layer while being separated from each other;
   a fourth nitride semiconductor layer formed over the third nitride semiconductor layer sandwiched between the source electrode and the drain electrode while being separated from each of the source electrode and the drain electrode; and
   a gate electrode for the field effect transistor formed over the fourth nitride semiconductor layer, wherein the band gap of the second nitride semiconductor layer is greater than the band gap of the first nitride semiconductor layer, wherein the third nitride semiconductor layer contains aluminum and is an n type semiconductor layer, wherein the fourth nitride semiconductor layer is a p type semiconductor layer, and wherein the second nitride semiconductor layer contains aluminum at a composition ratio smaller than the aluminum composition ratio of the third nitride semiconductor layer or contains no aluminum, wherein the second nitride semiconductor layer contains a first n type impurity, wherein the third nitride semiconductor layer contains a second n type impurity, and wherein the concentration of the second n type impurity of the third nitride semiconductor layer is greater than the concentration of the first n type impurity of the second nitride semiconductor layer.

2. The semiconductor device according to claim 1,
wherein the fourth nitride semiconductor layer contains magnesium or carbon.

3. The semiconductor device according to claim 1,
wherein the fourth nitride semiconductor layer comprises:
a fifth nitride semiconductor layer formed over the third nitride semiconductor layer sandwiched between the source electrode and the drain electrode while being separated from each of the source electrode and the drain electrode; and
a sixth nitride semiconductor layer formed over the fifth nitride semiconductor layer,
wherein the fifth nitride semiconductor layer contains carbon, and
wherein the sixth nitride semiconductor layer contains magnesium.

4. The semiconductor device according to claim 1,
wherein the fourth nitride semiconductor layer contains magnesium and carbon,
wherein the magnesium concentration of the fourth nitride semiconductor layer decreases from the interface between the fourth nitride semiconductor layer and the gate electrode to the interface between the fourth nitride semiconductor layer and the third nitride semiconductor layer, and
wherein the carbon concentration of the fourth nitride semiconductor layer increases from the interface between the fourth nitride semiconductor layer and the gate electrode to the interface between the fourth nitride semiconductor layer and the third nitride semiconductor layer.

5. The semiconductor device according to claim 1,
wherein the fourth nitride semiconductor layer contains aluminum.

6. The semiconductor device according to claim 1, further comprising:
a seventh nitride semiconductor layer formed over the third nitride semiconductor layer sandwiched between the fourth nitride semiconductor layer and the source electrode or over the third nitride semiconductor layer sandwiched between the fourth nitride semiconductor layer and the drain electrode,
wherein the seventh nitride semiconductor layer has a p type semiconductor layer which is the same layer as the fourth nitride semiconductor layer, and
wherein the seventh nitride semiconductor layer has a thickness smaller than the thickness of the fourth nitride semiconductor layer.

7. The semiconductor device according to claim 1,
wherein the first nitride semiconductor layer has indium gallium nitride or gallium nitride,
wherein the second nitride semiconductor layer has aluminum gallium nitride,
wherein the third nitride semiconductor layer has aluminum gallium nitride,
wherein the fourth nitride semiconductor layer has gallium nitride, and
wherein the second nitride semiconductor layer contains aluminum at a composition ratio smaller than the aluminum composition ratio of the third nitride semiconductor layer.

8. The semiconductor device according to claim 1,
wherein the first nitride semiconductor layer has indium gallium nitride,
wherein the second nitride semiconductor layer has gallium nitride,
wherein the third nitride semiconductor layer has aluminum gallium nitride, and
wherein the fourth nitride semiconductor layer has gallium nitride.

9. The semiconductor device according to claim 1, wherein an aluminum composition ratio of the fourth nitride semiconductor layer increases from the interface between the fourth nitride semiconductor layer and the gate electrode to the interface between the fourth nitride semiconductor layer and the third nitride semiconductor layer.

* * * * *